US012690333B2

(12) United States Patent
Zhu et al.

(10) Patent No.: US 12,690,333 B2
(45) Date of Patent: Jul. 21, 2026

(54) DISPLAY PANEL AND MANUFACTURING METHOD THEREOF, AND DISPLAY DEVICE

(71) Applicant: Wuhan Tianma Micro-Electronics Co., Ltd., Wuhan (CN)

(72) Inventors: Shuangli Zhu, Wuhan (CN); Dan Huang, Wuhan (CN); Chenhang Sheng, Wuhan (CN); Xianbin Feng, Wuhan (CN); Qiyong Ke, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 380 days.

(21) Appl. No.: 18/212,418

(22) Filed: Jun. 21, 2023

(65) Prior Publication Data

US 2024/0179954 A1     May 30, 2024

(30) Foreign Application Priority Data

Nov. 30, 2022     (CN) .......................... 202211527036.6

(51) Int. Cl.
H10K 59/122     (2023.01)
H10K 59/12     (2023.01)
H10K 71/16     (2023.01)

(52) U.S. Cl.
CPC ....... H10K 59/122 (2023.02); H10K 59/1201 (2023.02); H10K 71/166 (2023.02)

(58) Field of Classification Search
CPC . H10K 59/122; H10K 59/1201; H10K 71/166
See application file for complete search history.

(56) References Cited

U.S. PATENT DOCUMENTS

| | | | | |
|---|---|---|---|---|
| 10,651,412 | B2 * | 5/2020 | Yang | ...................... H10K 50/16 |
| 2018/0151631 | A1 * | 5/2018 | Lee | ....................... H10K 59/38 |
| 2022/0231100 | A1 * | 7/2022 | Harada | ............... H10K 59/122 |

FOREIGN PATENT DOCUMENTS

| | | |
|---|---|---|
| CN | 106876331 A | 6/2017 |
| CN | 113314579 A | 8/2021 |
| CN | 115132796 A | 9/2022 |

* cited by examiner

*Primary Examiner* — Elmito Breval
(74) *Attorney, Agent, or Firm* — Anova Law Group, PLLC

(57)     ABSTRACT

A display panel including a plurality of pixel areas and at least a non-pixel area located between two adjacent pixel areas; a substrate; a pixel definition layer located on one side of the substrate, the pixel definition layer including a pixel definition structure located in the non-pixel area and an opening located in the pixel area; a blocking part, the blocking part being disposed on a side of the pixel definition structure away from the substrate; and a light emitting device layer, the light emitting device layer including an organic common layer, the organic common layer being located on a side of the blocking part away from the substrate, where the blocking part includes at least one protrusion, the protrusion including a first bottom surface close to the substrate, a first sidewall, and a second sidewall opposite to the first sidewall.

16 Claims, 23 Drawing Sheets

100

B-B

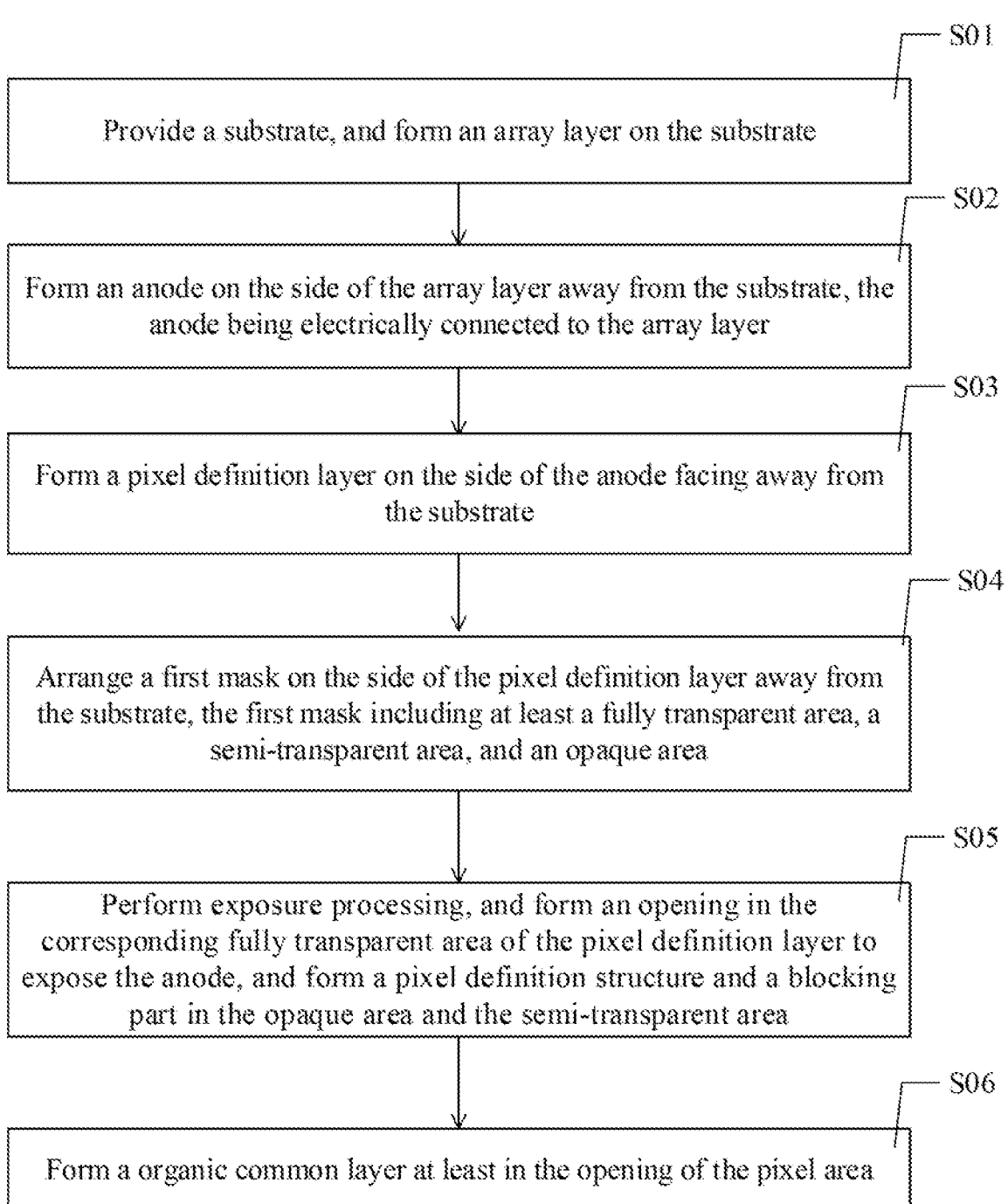

S01

Provide a substrate, and form an array layer on the substrate

S02

Form an anode on the side of the array layer away from the substrate, the anode being electrically connected to the array layer

S03

Form a pixel definition layer on the side of the anode facing away from the substrate

S04

Arrange a first mask on the side of the pixel definition layer away from the substrate, the first mask including at least a fully transparent area, a semi-transparent area, and an opaque area

S05

Perform exposure processing, and form an opening in the corresponding fully transparent area of the pixel definition layer to expose the anode, and form a pixel definition structure and a blocking part in the opaque area and the semi-transparent area

S06

Form a organic common layer at least in the opening of the pixel area

FIG. 17

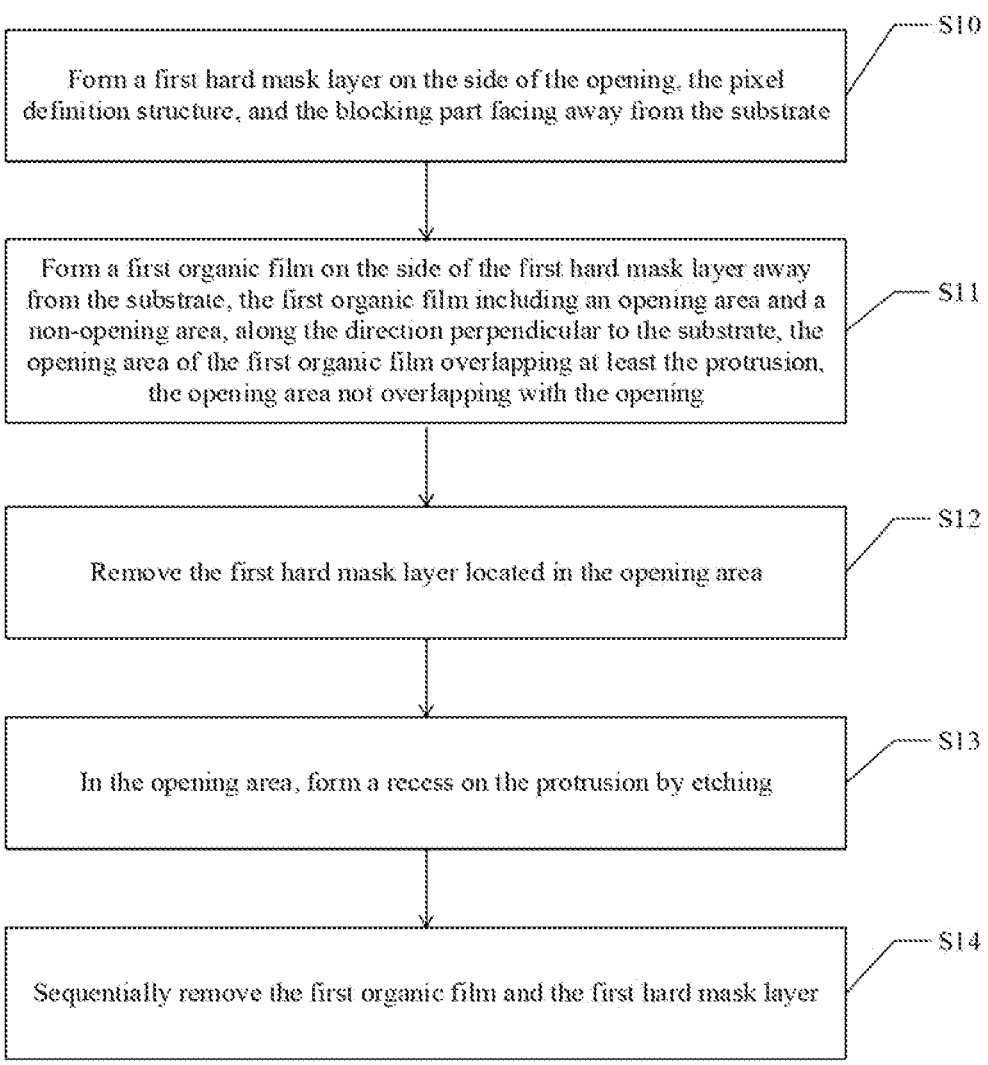

Form a first hard mask layer on the side of the opening, the pixel definition structure, and the blocking part facing away from the substrate ⟋ S10

Form a first organic film on the side of the first hard mask layer away from the substrate, the first organic film including an opening area and a non-opening area, along the direction perpendicular to the substrate, the opening area of the first organic film overlapping at least the protrusion, the opening area not overlapping with the opening ⟋ S11

Remove the first hard mask layer located in the opening area ⟋ S12

In the opening area, form a recess on the protrusion by etching ⟋ S13

Sequentially remove the first organic film and the first hard mask layer ⟋ S14

FIG. 25

DISPLAY PANEL AND MANUFACTURING METHOD THEREOF, AND DISPLAY DEVICE

CROSS-REFERENCE TO RELATED APPLICATIONS

This application claims the priority of Chinese patent application No. 202211527036.6, filed on Nov. 30, 2022, the entirety of which is incorporated herein by reference.

TECHNICAL FIELD

The present disclosure relates to the field of display technology and, more specifically, to a display panel and a manufacturing method thereof, and a display device.

BACKGROUND

Organic light-emitting diode (OLED) is considered to be a new generation of display technology that is expected to replace thin film transistor-liquid crystal displays (TFT-LCD) due to its many advantages such as self-illumination, thinness, good color gamut, and lower power consumption.

At present, OLED technology has gradually matured and it slowly entering the market. An OLED display device includes an organic light-emitting diode for converting electrical energy into light energy, and the organic light-emitting diode includes an anode, a cathode, and an organic layer disposed between the cathode and the anode. During the display process, holes and electrons respectively injected from the anode and the cathode combine in the organic layer to form electron-hole pairs. While failing from an excited state to a ground state, the formed electron-hole pairs emit light and display an image.

In the organic layer described above is formed in the pixel area and is located on the anode, and the cathode is formed on the organic layer. In the process of evaporating the organic layer, an organic layer will also be formed in the non-pixel area, and at least the organic layer in the pixel area and the non-pixel area are connected. That is, there may be interconnected organic layers between different sub-pixels. Under the drive of the current, it is very likely that sub-pixels will steal light.

SUMMARY

One aspect of the present disclosure provides a display panel. The display panel includes a plurality of pixel areas and at least a non-pixel area located between two adjacent pixel areas; a substrate; a pixel definition layer located on one side of the substrate, the pixel definition layer including a pixel definition structure located in the non-pixel area and an opening located in the pixel area; a blocking part, the blocking part being disposed on a side of the pixel definition structure away from the substrate; and a light emitting device layer, the light emitting device layer including an organic common layer, the organic common layer being located on a side of the blocking part away from the substrate. The blocking part includes at least one protrusion, and the protrusion includes a first bottom surface close to the substrate, a first sidewall, and a second sidewall opposite to the first sidewall. An angle between the first sidewall and the first bottom surface is $\alpha$, an angle between the second sidewall and the first bottom surface is $\beta$, one of $\alpha$ and $\beta$ is greater than the other.

Another aspect of the present disclosure provides a display panel manufacturing method. The method includes providing a substrate and forming an array layer on the substrate; forming an anode on a side of the array layer away from the substrate, the anode being electrically connected to the array layer; forming a pixel definition layer on a side of the anode facing away from the substrate; arranging a first mask on a side of the pixel definition layer away from substrate, the first mask including a fully transparent area and an opaque area, or the first mask including the fully transparent area, the opaque area, and a semi-transparent area; forming an opening in the fully transparent area and exposing the anode by exposure; forming a first hard mask layer on a side of the opening and the pixel definition layer away from the substrate, forming a second organic film on a side of the first hard mask layer, and processing the second organic film to form an opening area and a non-opening area on the second organic film, the opening area overlapping with the pixel definition layer along a direction perpendicular to the substrate; removing the first hard mask layer located in the opening area; forming a blocking part and a pixel definition structure on the pixel definition layer by etching, the blocking part being disposed on a side of the pixel definition structure away from the substrate, the blocking part including at least one protrusion, the protrusion including a first bottom surface close to the substrate, a first sidewall, and a second sidewall opposite to the first sidewall, an angle between the first sidewall and the first bottom surface being $\alpha$, an angle between the second sidewall and the first bottom surface being $\beta$, one of $\alpha$ and $\beta$ being greater than the other; sequentially removing the second organic film and the first hard mask layer; and forming an organic common layer at least in the opening of a pixel area.

Another aspect of the present disclosure provides another display panel manufacturing method. The method includes providing a substrate and forming an array layer on the substrate; forming an anode on a side of the array layer away from the substrate, the anode being electrically connected to the array layer; forming a pixel definition layer on a side of the anode facing away from the substrate; arranging a first mask plate on a side of the pixel definition layer away from the substrate, the first mask plate including at least a fully transparent area, a semi-transparent area, and an opaque area; performing exposure process to form an opening in a corresponding fully transparent area on the pixel definition layer to expose the anode, and to form a pixel definition structure and a blocking part in the opaque area and the semi-transparent area, the blocking part being disposed on a side of the pixel definition structure away from the substrate, the blocking part including at least one protrusion, the protrusion including a first bottom surface close to the substrate, a first sidewall, and a second sidewall opposite to the first sidewall, an angle between the first sidewall and the first bottom surface being $\alpha$, an angle between the second sidewall and the first bottom surface being $\beta$, one of $\alpha$ and $\beta$ being greater than the other; and forming an organic common layer at least in the opening of a pixel area.

Of course, any product implementing the technical solutions of the present disclosure does not need to achieve all of the technical effects described above at the same time.

Other features of the present disclosure and advantages thereof will become apparent from the following detailed description of exemplary embodiments of the present disclosure with reference to the accompanying drawings.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

FIG. 17 is a flowchart of a display panel manufacturing method according to an embodiment of the present disclosure.

FIG. 25 is another flowchart of the display panel manufacturing method of a fixed display panel according to an embodiment of the present disclosure.

DETAILED DESCRIPTION OF THE EMBODIMENTS

Figure 1:
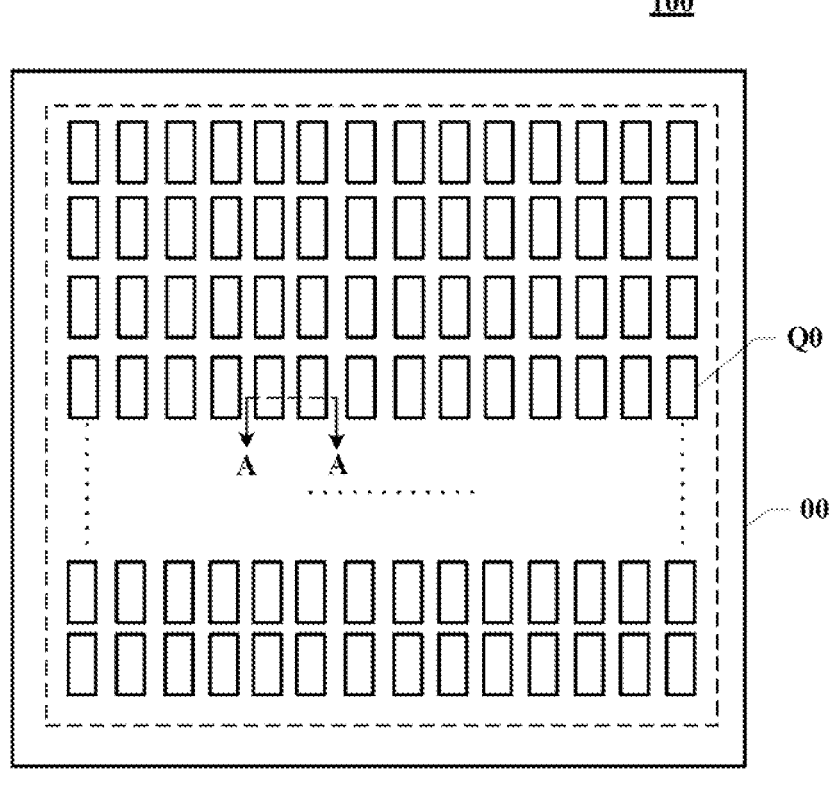
FIG. 1 is a schematic plan view of a display panel according to an embodiment of the present disclosure.

Various exemplary embodiments of the present disclosure are described in detail with reference to the drawings. It should be noted that relative arrangement of components and steps, numerical expressions and values clarified in the embodiments are not intended to limit the scope of the present disclosure, unless otherwise specified.

The following description of the at least one exemplary embodiment is merely illustrative and shall not be construed as any limitation on the present disclosure and its application or use.

Techniques, methods and apparatus known to those skilled in the art may not be discussed in detail, but the techniques, methods and apparatus should be considered as a part of the specification where appropriate.

In all of the examples shown and discussed herein, any specific values are to be construed as illustrative only rather than limitation. Thus, different values may be used in other examples of the exemplary embodiments.

It is obvious to those skilled in the art that various modifications and changes can be made in this disclosure without departing from the spirit or scope of this disclosure. Therefore, this disclosure intends to cover the amendments and changes of this application that fall within the scope of the corresponding claims (claimed technical solutions) and their equivalents. It should be noted that the implementation manners provided in the embodiments of the present disclosure can be combined with each other if there is no contradiction.

It should be noted that similar reference numerals and letters indicate similar items in the following drawings. Therefore, once an item is defined in one drawing, the item is unnecessary to be further discussed in subsequent drawings.

In the OLED display panel in conventional technology, since the organic layer is located in the pixel area and the non-pixel area at the same time, when only one of the two adjacent pixels areas needs to emit light, the current driving the pixel area to emit light will leak through the organic layer to the other pixel area, such that light stealing will occur in the pixel area that is not expected to emit light, which affects the display effect of the display panel.

In view of the foregoing, embodiments of the present disclosure provide a display panel. The display panel may include a plurality of pixel areas and at least one non-pixel area located between two adjacent pixels areas. The display panel may further include a substrate; a pixel definition layer located on one side of the substrate, including a pixel definition structure located in the non-pixel area and an opening located in the pixel area; a blocking part disposed on a side of the pixel definition structure away from the substrate; a light emitting device layer including an organic common layer, the organic common layer being located on a side of the blocking part away from the substrate. The blocking part may include at least one protrusion. The protrusion may include at first bottom surface close to the substrate, a first sidewall and a second sidewall opposite to the first sidewall. The angle between the first sidewall and the first bottom surface may be α, and the angle between the second sidewall and the first bottom surface may be β, where one of α and β may be larger than the other. In the present disclosure, the asymmetric protrusion in the blocking part may extend the routing path of the organic common layer, and reduce the amount of the organic common layer on the side of the protrusion facing away from the substrate, and even the organic common layer may be able to cut off on the side of the protrusion facing away from the substrate. In this way, the driving current in a certain pixel area may not be able to leak to the adjacent pixel area; or, only a small amount of current sufficient to drive the light emitting device layer to emit light may be transmitted to the adjacent pixel area. In this way, the leakage phenomenon of the display panel can be effectively improved, thereby helping to improve the overall display effect of the display panel.

In order to make the objectives, technical solutions, and advantages of the present disclosure more clear, the technical solutions in the embodiments of the present disclosure will be described below with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

Figure 2:
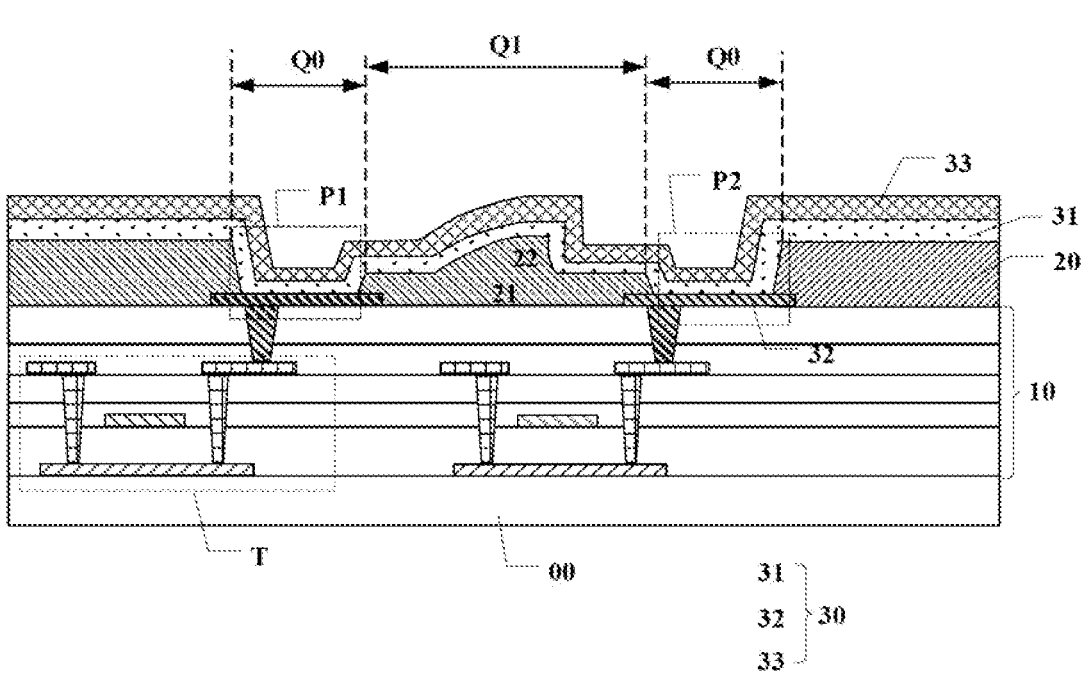
FIG. 2 is a cross-sectional view of the display panel shown in FIG. 1 along line A-A.
Figure 3:
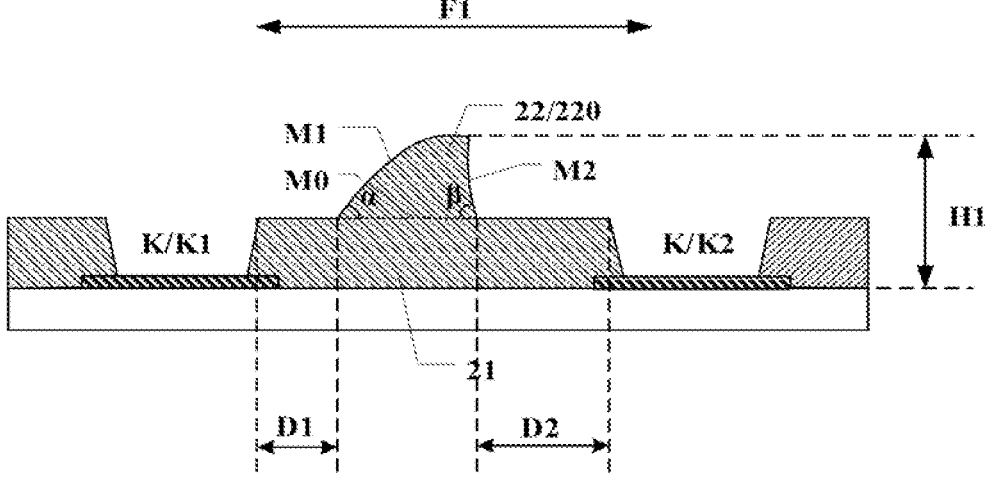
FIG. 3 is a schematic structural diagram of a non-pixel area between two adjacent pixel areas.

FIG. 1 is a schematic plan view of a display panel 100 according to an embodiment of the present disclosure, FIG. 2 is a cross-sectional view of the display panel shown in FIG. 1 along line A-A, and FIG. 3 is a schematic structural diagram of a non-pixel area between two adjacent pixel areas. Referring to FIG. 1 to FIG. 3, the display panel 100 provided by the embodiments of the present disclosure may include a plurality of pixel areas Q0 and at least one non-pixel area Q1 located between two adjacent pixel areas Q0. The display panel 100 may further include a substrate 00; a pixel definition layer 20 located on one side of the substrate 00 including a pixel definition structure 21 located in the non-pixel area Q1 and an opening K located in the pixel area Q0; a blocking part 22 disposed on the side of the pixel definition structure 21 away from the substrate 00; and a light emitting device layer 30. The light emitting device layer 30 may include an organic common layer 31, and the organic common layer 31 may be located on the side of the blocking part 22 away from the substrate 00. The blocking part 22 may include at least one protrusion 220, and the protrusion 220 may include a first bottom surface M0 close to the substrate 00, and a first sidewall M1 opposite to a second sidewall M2. The angle between the first sidewall M1 and the first bottom surface M0 may be a, and the angle between the second sidewall M2 and the first bottom surface M0 may be β, and one of α and β may be larger than the other.

In some embodiments, the display panel may be a display panel using organic light emitting diode display technology, that is, an OLED display panel. The basic structure of the light emitting device layer 30 generally includes an anode 32, an organic common layer 31, and a cathode 33. When an appropriate voltage is provided, the holes in the anode 32 and the electrons in the cathode 33 will combine in the light emitting device layer 30 to produce light. Compared with the thin-film field effect transistor liquid crystal displays, OLED display panels have the characteristics of high visibility and high brightness, and are more power efficient, lighter in weight, and thinner in thickness. The opening K described in the present disclosure can be regarded as the area defined by the pixel definition layer 20, for accommodating the light emitting material layer, that is, the corresponding pixel area, and areas other than the pixel areas in the display area may be the non-pixels areas.

Referring to FIG. 2, in some embodiments, a driving layer 10 may be arranged between the substrate 00 and the light emitting device layer 30. The driving layer 10 may include a transistor T for providing an electrical signal to the anode 32 of the light emitting device layer 30. Although only the transistor T connected to the anode 32 is shown in the film structure of FIG. 2, in some embodiments, the driving layer 10 may also include other transistors that are not directly connected to the anode 32 of the light emitting device layer 30. For example, the driving layer may include a plurality of pixels driving circuits, and each pixel driving circuit may include at least two transistors. In some embodiments, the anode 32 corresponding to different light emitting device layers 30 may be connected to different pixel driving circuits. The pixel driving circuit may be a 2T1C circuit (two transistors and one capacitor), a 7T1C circuit, an 8T1C circuit, or other circuits in conventional technology, which is not limited in the embodiments of the present disclosure.

Referring to FIG. 1 to FIG. 3, in the display panel provided in the embodiments of the present disclosure, the pixel definition layer 20 may include a pixel definition structure 21 located in the non-pixel area and an opening K located in the pixel area. The opening K may be used to arrange the light emitting device layer 30. Driven by the current, the light emitting device layer 30 in the opening can emit light to realize the display function. In some embodiments, the light emitting device layer 30 may include an organic common layer 31. When forming the organic common layer 31, part of the organic common layer 31 may be located in the pixel area Q0, and part of the organic common layer 31 may be located in the non-pixel area Q1. In the present disclosure, the blocking part 22 may be arranged on the side of the pixel definition structure 21 away from the substrate 00. The blocking part 22 may include at least one protrusion 220, and the protrusion 220 may be an asymmetric structure. Along the arrangement direction of two adjacent pixel areas Q0, the protrusion 220 between the two pixel areas may include a first sidewall M1 and a second sidewall M2. The angle between the first sidewall M1 and the first bottom surface M0 may be $\alpha$, the angle between the second sidewall M2 and the first bottom surface M0 may be $\beta$, $\alpha$ and $\beta$ being different. When the organic common layer 31 is formed in the pixel area Q0 and the non-pixel area Q1, the asymmetric protrusion 220 in the blocking part 22 may extend the routing path of the organic common layer 31, and reduce the amount of the organic common layer 31 on the side of the protrusion 220 facing away from the substrate 00, and even the organic common layer 31 may be able to cut off on the side of the protrusion 220 facing away from the substrate. In this way, the driving current in a certain pixel area may not be able to leak to the adjacent pixel area; or, only a small amount of current sufficient to drive the light emitting device layer 30 to emit light may be transmitted to the adjacent pixel area. In this way, the leakage phenomenon of the display panel can be effectively improved, thereby helping to improve the overall display effect of the display panel.

In particular, considering that the side of the blocking part 22 facing away from the substrate 00 is provided with a cathode, when the blocking part 22 is introduced, if the angles between the first sidewall M1 and the second sidewall M2 and the first bottom surface M0 are all set to be relatively small, both the first sidewall M1 and the second sidewall M2 may be relatively gentle, and a relatively gentle organic common layer 31 may be formed on the first sidewall M1 and the second sidewall M2, which cannot effectively block the organic common layer 31. If the angles between the first sidewall M1 and the second sidewall M2 and the first bottom surface M0 are all set to be relatively large, both the first sidewall M1 and the second sidewall M2 may be relatively steep, and the amount of the organic common layer 31 formed on the side of the first sidewall M1 and the second sidewall M2 away from the substrate 00 may be limited or even cut off the organic common layer 31. However, at the same time, the amount of cathode 33 formed on the side away from the substrate 00 of the first sidewall M1 and the second sidewall M2 may also be reduced, which has a greater impact on the overall impedance of the cathode 33.

Therefore, in the present disclosure, the angles between the two opposite sidewalls of the protrusion 220 in the blocking part 22 and the first bottom surface M0 are set to be different, one of the first sidewall M1 and the second sidewall M2 may be relatively steep, and the other may be relatively gentle. In this way, the user of the steep sidewall can better block the organic common layer 31. In addition, due to the existence of the gentle sidewall, the amount of cathode that can be provided on the side of the first sidewall and the second sidewall away from the substrate can be ensured, thereby avoiding a relatively large impact on the cathode resistance, which improves the light stealing of the sub-pixels, and ensures the display effect.

It should be noted that FIG. 1 only uses a display panel with a rectangular structure as an example for illustration, but the present disclosure does not limit the actual shape of the display panel. In some other embodiments of the present disclosure, the shape of the display panel may also be a rounded rectangle, a circle, or other irregular shapes. In addition, FIG. 1 only illustrates some pixel areas in the display area, and does not represent the actual number of pixel areas included in the display panel. FIG. 2 is only a schematic illustration of a film layer structure of the display panel, and does not represent the actual number and thickness of the film layers included in the display panel.

It should also be noted that the implementations shown in FIG. 2 and FIG. 3 only show the technical solution that the blocking part 22 of the non-pixel area Q1 between adjacent pixel areas Q0 includes one protrusion 220, but the present disclosure is not limited thereto. In some other embodiments of the present disclosure, the same blocking part 22 may also include two or more protrusions 220, which will be described in subsequent embodiments.

Referring to FIG. 2 and FIG. 3, in some embodiments, the opening K may include a first opening K1 and a second opening K2. The light emitting device layer 30 may include a first color light emitting device P1 and a second color light emitting device P2. The first opening K1 may correspond to the first color light emitting device P1, the second opening K2 may correspond to second color light emitting device P2, and the wavelength of light emitted by the first color light emitting device P1 may be greater than the wavelength of light emitted by the second color light emitting device P2. The first opening K1 and the second opening K2 may be located on both sides of the protrusion 220 and both may be adjacent to the protrusion 220. Along a first direction F1, the first opening K1 may be located on the side of the first sidewall M1 away from the second sidewall M2, and the second opening K2 may be located on the side of the second sidewall M2 away from the first sidewall M1. The first direction may be an arrangement direction of the first opening K1 and the second opening K2 adjacent to the same protrusion 220, where $\alpha < \beta$.

This embodiment illustrates a method of arranging a protrusion when the protrusion is arranged between light emitting devices of two colors with different wavelengths. More specifically, assume that the light emitting devices located on both sides of the same protrusion along the first direction and adjacent to the protrusion are respectively the first color light emitting device P1 and the second color light emitting device P2, where the wavelength of light emitted by the first color light emitting device P1 is greater than the wavelength of light emitted by the second color light emitting device P2. At this time, the turn-on voltage of the first color light emitting device P1 may be lower than the turn-on voltage of the second color light emitting device P2. That is, assume that in the first color light emitting device P1 and the second color light emitting device P2 that are adjacently arranged, only the second color light emitting device P2 needs to emit light and the first color light emitting device P1 does not need to emit light, then the driving voltage only needs to be provided to the second color light emitting device P2. In conventional technology, since the organic common layer between the first color light emitting device P1 and the second color light emitting device P2 is connected, the relatively large driving voltage provided to the second color light emitting device P2 may be transmitted to the first color light emitting device P1 through the organic common layer. Since the turn-on voltage required by the first color light emitting device P1 is relatively small, when the relatively large driving voltage supplied to the second color light emitting device P2 is transmitted to the first color light emitting device P1, it is likely to cause the first color light emitting device P1 to steal light, thereby affecting the overall display effect. In the present disclosure, after the protrusion is introduced into the blocking part 22 between the first color light emitting device P1 and the second color light emitting device P2, the second sidewall M2 adjacent to the second color light emitting device P2 in the protrusion may be set to be relatively steep. In this way, the step difference between the top of the second sidewall M2 and the first bottom surface of the protrusion can be relatively large, the organic common layer is likely to be disconnected at the top of the second sidewall M2, or only a small thickness of the organic common layer can be left at the top of the second sidewall M2. When the driving voltage supplied to the second color light emitting device P2 reaches the top position corresponding to the second sidewall M2, the driving voltage cannot be further transmitted to the first color light emitting device P1, or because the organic common layer at the top position is thin with high impedance, only a relatively small amount of voltage may be transmitted to the first color light emitting device P1, which is not enough to drive the first color light emitting device P1 to emit light. In this way, the light stealing phenomenon of the first color light emitting device P1 can be effectively improved, thereby improving the display effect of the display panel.

Referring to FIG. 2 and FIG. 3, in some embodiments, $0° < \alpha \geq 70°$ and $60° \leq \beta \leq 100°$. More specifically, in the protrusion 220, the steeper the first sidewall M1 is, the better the improving effect of the leakage current between the sub-pixels is. Considering that the first sidewall M1 is adjacent to the first color light emitting device P1 with a relatively small turn-on voltage, even if the electrical signal supplied to the first color light emitting device P1 leaks to the second color light emitting device P2, it is not enough to light up the second color light emitting device P2. Therefore, the first sidewall M1 in the protrusion may be set to be $0° < \alpha \geq 70°$ without increasing the process difficulty. In the first protrusion 211, the second sidewall M2 may be adjacent to the second color light emitting device with a relatively large turn-on voltage, and the steeper the second sidewall M2 is, the better it is to improve the blocking effect of the leakage current. For example, the step difference between the top and the bottom of the second sidewall M2 may be increased, the transmission path of the leakage current may be increase, and the degree of attenuation of the leakage current may be increased to avoid light stealing. Within the allowable range of the process, the angle between the second sidewall M2 and the first bottom surface may be set to $60° \leq \beta \leq 100°$ to improve the light stealing phenomenon.

In some embodiments, $40° \leq \alpha \leq 60°$, $30° \leq \alpha \leq 50°$, $90° \leq \beta \leq 100°$, and $80° \leq \beta \leq 90°$.

In some embodiments, the second color light emitting device P2 may be a blue light emitting device. In some embodiments, the display panel may include a red light emitting device, a green light emitting device, and a blue light emitting device. The light emitting devices of three different colors can emit light to realize the color display function of the display panel. Among the light emitting devices of the three colors described above, the blue light emitting device may have the shortest wavelength and the largest turn-on voltage. Therefore, when the second color light emitting device P2 is set as a blue light emitting device, it is beneficial to avoid the relatively large voltage provided to the blue light emitting device from being transmitted to other color light emitting devices adjacent to it, causing the light emitting devices of other colors to steal light. In some embodiments, the first color light emitting device P1 may be a red light emitting device or a green light emitting device.

Referring to FIG. 2 and FIG. 3, in some embodiments, along the direction from the first opening K1 to the second opening K2, the minimum distance between the blocking part 22 and the first opening K1 may be D1, and the minimum distance between the blocking part 22 and the second opening K2 may be D2, where D1<D2.

More specifically, when the turn-on voltage corresponding to the second color light emitting device P2 arranged in the second opening K2 is relatively large, its leakage current to other color light emitting devices adjacent to it will be relatively large. In this embodiment, the minimum distance D2 between the blocking part 22 and the second opening K2 adjacent to it can be set to be greater than the minimum distance D1 between the blocking part 22 and the first opening K1 adjacent to it, which is beneficial to increasing the leakage path from the second color light emitting device P2 to the first color light emitting device P1, reducing the amount of electrical signals transmitted from the second color light emitting device P2 to the first color light emitting device P1, thereby improving the leakage phenomenon and avoiding the light emitting device from stealing light.

It should be noted that the minimum distance D1 between the blocking part 22 and the first opening K1 described in the embodiments of the present disclosure may refer to, in the blocking part 22 and the first opening K1 adjacent thereto, the minimum distance between the first sidewall M1 of the protrusion 220 facing the first opening K1 and the edge of the first opening K1 facing the blocking part 22 in the blocking part 22. Similarly, the minimum distance D2 between the blocking part 22 and the second opening K2 described in the embodiments of the present disclosure may refer to, in the blocking part 22 and the second opening K2 adjacent thereto, the minimum distance between the second sidewall M2 of the protrusion 220 facing the second opening K2 and the edge of the second opening K2 facing the blocking part 22 in the blocking part 22.

In some embodiments, along the direction perpendicular to the substrate 00, the total thickness of the protrusion and the pixel definition structure 21 may be H1, where 1.5 μm≤H1≤2.5 μm.

It should be noted that the total thickness of the protrusion 220 and the pixel definition structure 21 directly determines the amount of the organic common layer that can be accommodated on the side of the protrusion away from the pixel definition structure 21. When the total thickness of the protrusion 220 and the pixel definition structure 21 is less than 1.5 μm, the thickness of the organic common layer that can be accommodated on the side of the protrusion away from the pixel definition structure 21 will be relatively large, and the improvement of the leakage current is limited, that is, light stealing may still occur. When the total thickness of the protrusion 220 and the pixel definition structure 21 is less than 2.5 μm, although the thickness of the organic common layer that can be accommodated on the side of the protrusion away from the pixel definition structure 21 is greatly reduced, the overall thickness of the display panel is also increase. Therefore, in the embodiments of the present disclosure, when the total thickness of the protrusion 220 and the pixel definition structure is set to 1.5 μm≤H1≤2.5 μm, the amount of the organic common layer located on the side of the protrusion away from the substrate 00 can be effectively reduced, and the impedance of the organic common layer can be increased to avoid the light stealing phenomenon, at the same time, the thickness of the display panel will not be affected, which is beneficial to meeting the thickness requirement of the display panel. In some embodiments, 1 μm≤H1≤2 μm, 1.2 μm≤H1≤2.4 μm, etc.

Figure 4:
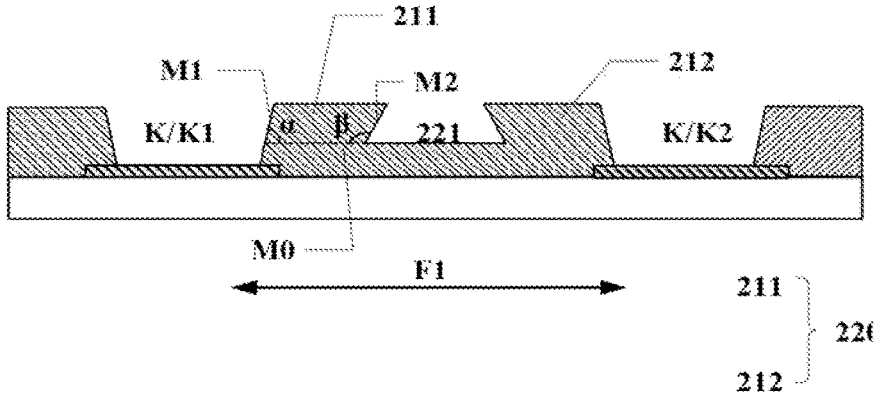
FIG. 4 is another schematic structural diagram of a non-pixel area between two adjacent pixel areas.

FIG. 4 is another schematic structural diagram of a non-pixel area between two adjacent pixel areas. In some embodiments, the opening K may include a first opening K1 and a second opening K2. The first opening K1 and the second opening K2 may be located on both sides of the protrusion 220 and both may be adjacent to the protrusion 220, and the first opening K1 and the second opening K2 may be arranged along the first direction F1. The protrusion 220 may include a first protrusion 211 and a second protrusion 212. Along the first direction F1, the first protrusion 211 may be located between the first opening K1 and the second opening K2, and the first sidewall of the first protrusion 211 may be adjacent to the first opening K1; and the second protrusion 212 may be located between the second opening K2 and the first protrusion 211, and the first sidewall of the second protrusion 212 may be adjacent to the second opening K2.

FIG. 4 shows another arrangement of the protrusion in the blocking part 22. More specifically, this embodiment shows a technical solution that the same blocking part 22 includes two protrusions, and the two protrusions are the first protrusion 211 and the second protrusion 212 respectively. The arrangement direction of the first protrusion 211 and the second protrusion 212 may be the same as the arrangement direction of the first opening K1 and the second opening K2. The first protrusion 211 may be disposed between the second protrusion 212 and the first opening K1, and the second protrusion 212 may be disposed between the first protrusion 211 and the second opening K2. The first sidewalls with the relatively gentle slope in the first protrusion 211 and the second protrusion 212 may be adjacent to the first opening K1 and the second opening K2 respectively. When two protrusions are introduced into the blocking part 22 between the first opening K1 and the second opening K2, the arrangement of the tow protrusions can be beneficial to increase the routing path of the organic common layer and the transmission path of the electrical signal. The longer the transmission path of the electrical signal, the more serious the attenuation of the signal. Therefore, even if the electrical signal provided to the second opening K2 is transmitted in the organic common layer, the amount of signal that can be transmitted to the first opening K1 will be reduced, thereby helping to reduce the phenomenon of light stealing of the sub-pixels at the first opening K1. In addition, the space between the two first protrusions 211 can also accommodate more organic common layers, thereby reducing the amount of the organic common layers on the side of the first protrusions 211 away from the substrate 00, and increasing the impedance of the organic common layers, which further reduces the amount of electrical signals that may be transmitted to the first opening K1, thereby effectively preventing the sub-pixels at the first opening K1 from stealing light.

Figure 5:
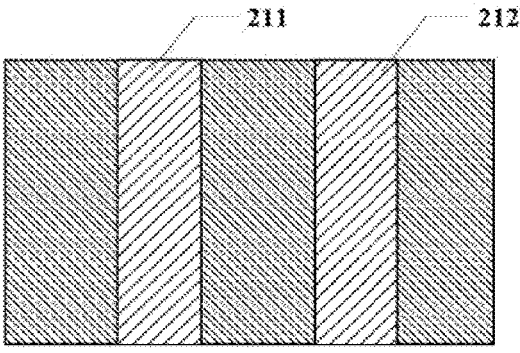
FIG. 5 is a schematic plan view of a first protrusion and a second protrusion located between two adjacent openings.

FIG. 5 is a schematic plan view of the first protrusion 211 and the second protrusion 212 located between two adjacent openings. Referring to FIG. 4 and FIG. 5, in some embodiments, the shape of the orthographic projection of the first protrusion 211 on the substrate 00 may be the same as the shape of the orthographic projection of the second protrusion 212 on the substrate 00.

More specifically, when the first protrusion 211 and the second protrusion 212 are introduced between two adjacent openings, in some embodiments, the first protrusion 211 and the second protrusion 212 may be formed in the same process. For example, when the first protrusion 211 and the second protrusion 212 are formed by introducing a masking process in combination with etching and other processes, the shapes of the openings on the mask plate corresponding to the first protrusion 211 and the second protrusion 212 may be the same. When the first protrusion 211 and the second protrusion 212 are arranged symmetrically, the corresponding openings on the mask plate may also be arranged symmetrically, which is beneficial to simplifying the manufacturing process of the mask plate, and further facilitating the simplification of the overall manufacturing process of the display panel.

In the embodiment shown in FIG. 4, the angle α between the first sidewall M1 and the first bottom surface M0 is an acute angle, and the angle β between the second sidewall M2 and the first bottom surface M0 is an obtuse angle as an example for illustration. When the angle β between the second sidewall M2 and the first bottom surface M0 is an acute angle, it can be seen that the end of the second sidewall M2 connected to the first bottom surface M0 is shifted toward the direction close to the first sidewall, such that the inner diameter of the groove bottom of a first groove 221 that forms between the first protrusion 211 and the second protrusion 212 can be greater than the inner diameter of the notch. This arrangement is equivalent to increasing the amount of organic common layer that the first groove 221 can accommodate, which not only effectively increases the routing path of the organic common layer and the transmission path of the electrical signal, but also reduces the amount of the organic common layer accommodate on the top of the first protrusion 211 and the second protrusion 212, reduce the amount of electrical signals transmitted through the organic common layer to the sub-pixels corresponding to the first opening K1, which is beneficial to improving the light stealing phenomenon of the sub-pixels.

Figure 6:
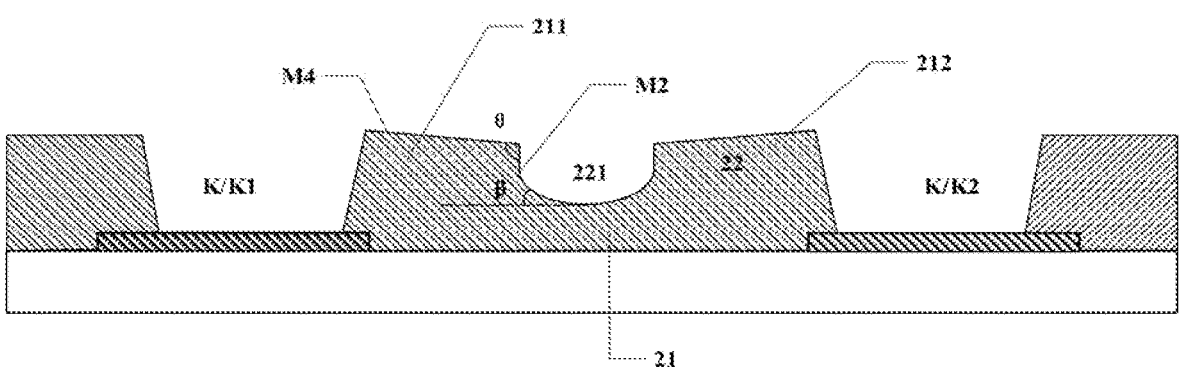
FIG. 6 is another schematic structural diagram of a non-pixel area between two adjacent pixel areas.
Figure 7:
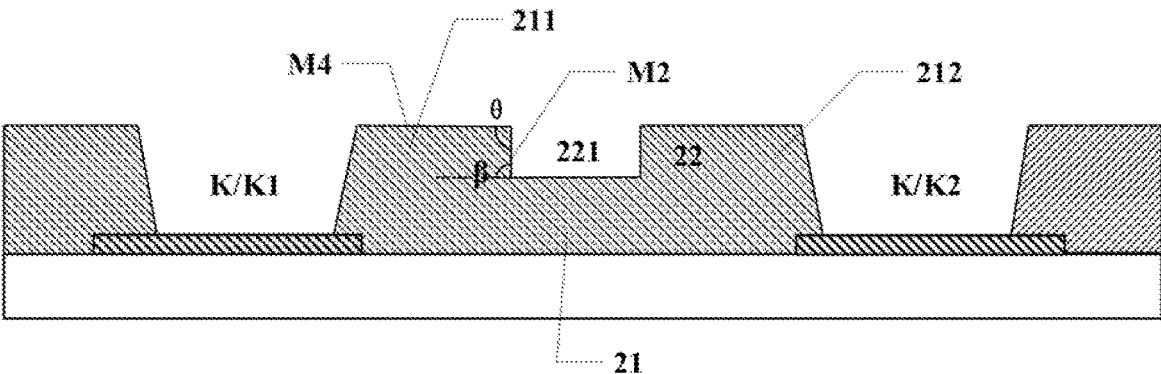
FIG. 7 is another schematic structural diagram of a non-pixel area between two adjacent pixel areas.
Figure 8:
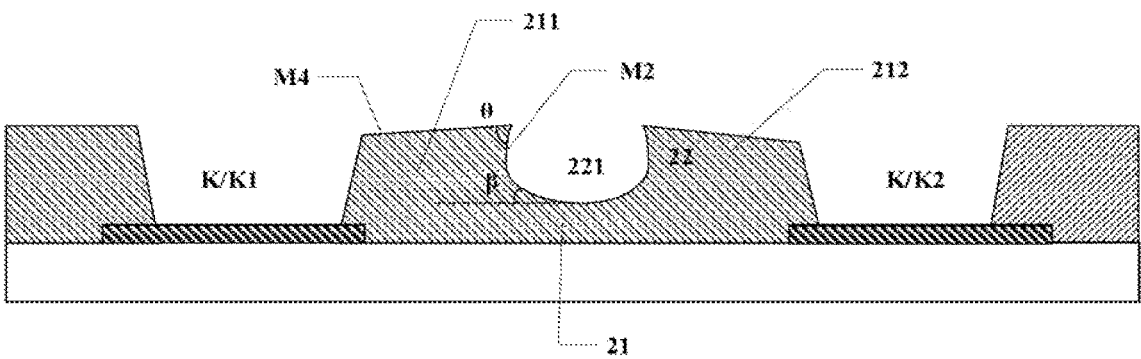
FIG. 8 is another schematic structural diagram of a non-pixel area between two adjacent pixel areas.

FIG. 6 to FIG. 8 are schematic structural diagrams of the non-pixel area between two adjacent pixel areas. In some embodiments, a first groove 221 may be formed between the second sidewall M2 of the first protrusion 211 and the second sidewall M2 of the second protrusion 212. The protrusion may include a first top surface M4 facing away from the substrate 00, and the angle between the first top surface M4 and the second sidewall M2 may be θ, where 85°≤θ<180°, and β≤90°.

More specifically, FIG. 6 to FIG. 8 respectively show several structures of the first protrusion 211 and the second protrusion 212 and the first groove 221 located between the first protrusion 211 and the second protrusion 212 when the first protrusion 211 and the second protrusion 212 are introduced into the blocking part 22 between the first opening K1 and the second opening K2. The embodiment shown in FIG. 6 takes the angle θ between the first top surface M4 and the second sidewall M2 as an obtuse angle and the bottom surface of the first protrusion 211 as an arc as an example for illustration. FIG. 7 takes the angle θ between the first top surface M4 and the second sidewall M2 as a right angle and the bottom surface of the first protrusion 211 as a plane as an example for illustration. FIG. 8 takes the angle θ between the first top surface M4 and the second sidewall M2 as an acute angle and the bottom surface of the first protrusion 211 as an arc as an example for illustration. In the three embodiments, the angle β between the second sidewall M2 and the first bottom surface is less than or equal to 90°. The first protrusion 211, the second protrusion 212, and the first groove 221 disposed between the first protrusion 211 and the second protrusion 212 of this structure can be formed by masking and etching processes, and the specific manufacture processes will be described in detail in subsequent embodiments. In this way, the routing path of the organic common layer and the transmission path of the electrical signals can be extended, the light stealing phenomenon of the sub-pixels can be improved, and the manufacturing process can be simplified.

It should be noted that when the angle between the first top surface M4 and the second sidewall M2 is not at 90°, the first top surface M4 will be an inclined structure, and the amount of the organic common layer accommodated on the inclined first top surface M4 will decreased. At the same time, since the first top surface M4 is an inclined structure, a protruding sharp corner will be formed at the position where the first top surface M4 joins with the first sidewall, or at the position where the first top surface M4 joins with the second sidewall M2, and the thickness of the organic common layer that can be accommodated above the protruding sharp corner will be smaller than the thickness of the organic common layer that can be accommodated at other positions. The impedance of the organic common layer at the protruding sharp corner will become larger, which is beneficial to reducing the amount of electrical signal transmitted from the second opening K2 to the first opening K1, thereby improving the light stealing phenomenon of the sub-pixels.

In some embodiments, the inner diameter of the notch of the first groove 221 may be less than 2 μm, such that the structure corresponding to the first protrusion 211, the second protrusion 212, and the first protrusion 211 in the present disclosure can be applied to products with a relatively high pixel density and a relatively small distance between the two adjacent openings, which can improve the light stealing phenomenon of the sub-pixels of these products.

In the embodiments shown in FIG. 6 to FIG. 8, the total thickness of the pixel definition structure 21 and the blocking part 22 may be set to 1.5 μm to 2.1 μm, the depth of the first groove 221 may be less than the total thickness. In some embodiments, the depth of the first groove 221 may be set to be between 0.7 μm to 1.3 μm to ensure that the first groove 221 has a relatively large space for accommodating the organic common layer while not penetrating through the pixel definition structure 21, thereby reducing the amount of the organic common layer accommodated on the first top surface M4 of the first protrusion 211 and the second protrusion 212.

Figure 9:
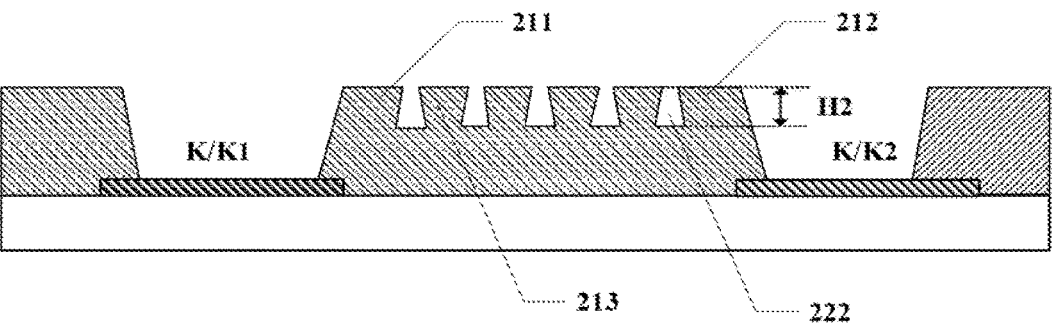
FIG. 9 is another schematic structural diagram of a non-pixel area between two adjacent pixel areas.
Figure 10:
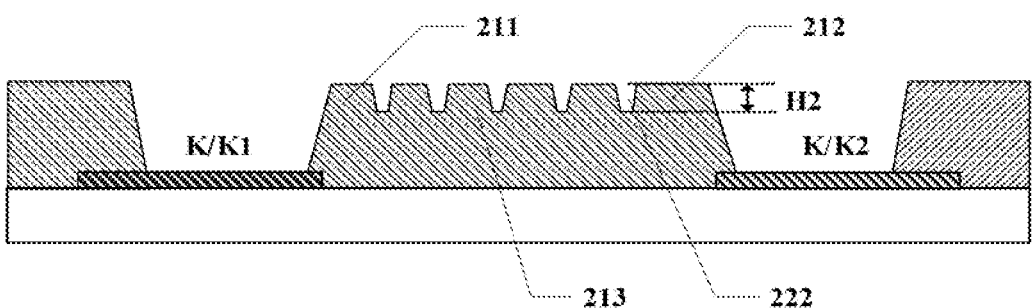
FIG. 10 is another schematic structural diagram of a non-pixel area between two adjacent pixel areas.

FIG. 9 and FIG. 10 respectively show the schematic structural diagrams of a non-pixel area between two adjacent pixel areas. In some embodiments, the blocking part 22 may also include at least one boss 213. The boss 213 may be located between the first protrusion 211 and the second protrusion 212. The second grooves 222 may be respectively formed between the boss 213 and the first protrusion 211, and between the boss 213 and the second protrusion 212.

More specifically, this embodiment shows a technical solution in which the first protrusion 211 and the second protrusion 212 are introduced into the blocking part 22 between the first opening K1 and the second opening K2, and four bosses 213 are introduced between the first protrusion 211 and the second protrusion 212. In FIG. 9 and FIG. 10, the number of bosses 213 shown is for illustration, and the number of bosses 213 actually included between the first protrusion 211 and the second protrusion 212 is not limited in the present disclosure. In some embodiments, when the bosses 213 are introduced between the first protrusion 211 and the second protrusion 212, the arrangement direction of the bosses 213 and the arrangement direction of the bosses 213 and the first protrusion 211 and the second protrusion 212 may both be the same as the arrangement direction of the first opening K1 and the second opening K2 located on both sides of the blocking part 22 and respectively adjacent to the blocking part 22. In this way, along the arrangement direction of the first opening K1 and the second opening K2, the second grooves 222 may be formed between adjacent bosses 213, between the first protrusion 211 and its adjacent bosses 213, and between the second protrusion 212 and its adjacent bosses 213, which is equivalent to increasing the number of grooves included in the blocking part. In this way, the routing path of the organic common layer between the first opening K1 and the second opening K2 and the transmission path of the electrical signals can be extended, and the size of the organic common layer that can be accommodated in the groove can be increased, which is beneficial to reducing the amount of organic common layer that can be accommodated on the upper surface of the first protrusion 211, the second protrusion 212, and the bosses 213. In this way, the impedance of the organic common layer can be increased, the leakage from the second opening K2 to the kl can be avoided, and the light stealing phenomenon of the sub-pixels can be avoided.

In some embodiments, in the embodiments shown in FIG. 9 and FIG. 10, the inner diameter of the notch of the second groove 222 may be less than 2 μm, such that the structure corresponding to the first protrusion 211, the second protrusion 212, and the first protrusion 211 in the present disclosure can be applied to products with a relatively high pixel density and a relatively small distance between the two adjacent openings, which can improve the light stealing phenomenon of the sub-pixels of these products.

The embodiment shown in FIG. 9 shows that the cross-section of the second groove 222 is a regular trapezoidal structure, and the embodiment shown in FIG. 10 shows that the cross-section of the second is an inverted trapezoidal structure. Both structures can play the role in accommodating the organic common layer. The regular trapezoidal structure provided in the embodiment shown in FIG. 9 has a larger size and can accommodate more organic common layers, which is beneficial to improving the light stealing phenomenon of the sub-pixels.

Referring to FIG. 9 and FIG. 10, in some embodiments, in the direction perpendicular to the substrate 00, the depth of at least one second groove 222 may be H2, and 0.7 μm≤H2≤1.3 μm.

It should be noted that when the inner diameter range of the second groove 222 is fixed, the depth of the second groove 222 directly determines the amount of organic common layer that can be accommodated in the second groove 222. When the depth of the second groove 222 is too shallow, such as less than 0.7 μm, the amount of organic common layer that can be accommodated is limited, and the amount of organic common layer that can be accommodated on the surface of the first protrusion 211, the second protrusion 212, and the boss 213 is still relatively large, and the leakage improvement is limited. If the depth of the second groove 222 is too deep, such as more than 1.3 μm, the second groove 222 may penetrate the pixel definition structure 21 and affect the performance of other structures in the display panel. Therefore, in this embodiment, when the depth of the second groove 222 is set to be between 0.7 μm to 1.3 μm, the amount of the organic common layer that can be accommodated in the groove can be ensured, the light stealing caused by leakage can be avoided, and other structures in the display panel will not be affected.

In some embodiments, the depth of the second groove 222 may be between 0.8 μm to 1.2 μm, between 0.9 μm to 1.1 μm, between 1 μm to 1.3 μm, etc., which is not limited in the embodiments of the present disclosure.

Referring to FIG. 9 and FIG. 10, in some embodiments, surfaces of the first protrusion 211, the second protrusion 212, and the boss 213 away from the pixel definition structure 21 may be located on the same plane.

When the upper surfaces of the first protrusion 211, the second protrusion 212, and the boss 213 are on the same plane, the first protrusion 211, the second protrusion 212, and the boss 213 may be made by using a mask with the same transmittance, which is beneficial to simplifying the manufacturing process. Referring to FIG. 9 and FIG. 10, in some embodiments, when a plurality of bosses 213 are introduced between the first protrusion 211 and the second protrusion 212, the shapes and sizes of the plurality of bosses 213 may be set to be the same, which is also beneficial to simplifying the overall the manufacturing process of the display panel.

Figure 11:
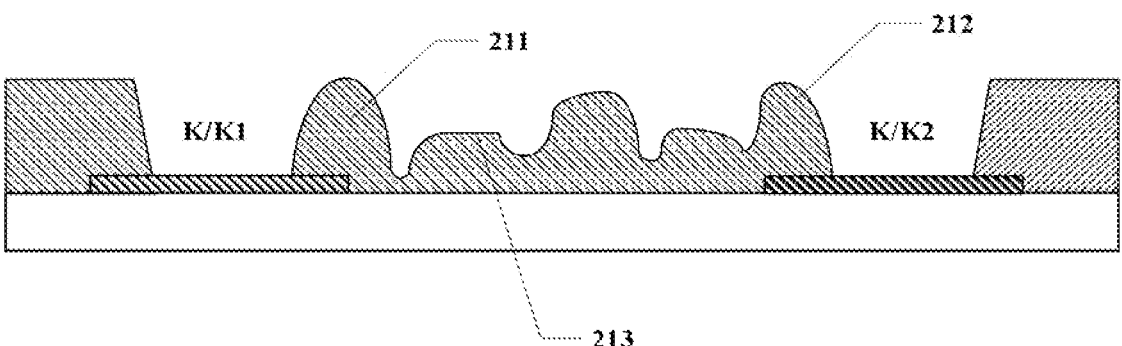
FIG. 11 is another schematic structural diagram of a non-pixel area between two adjacent pixel areas.

FIG. 11 is another schematic structural diagram of a non-pixel area between two adjacent pixel areas. Referring to FIG. 11, in some embodiments, the surface of at lest one of the first protrusion 211, the second protrusion 212, and the boss 213 facing away from the pixel definition structure 21 may be a convex arc surface.

This embodiment shows a technical solution in which three bosses 213 are provided between the first protrusion 211 and the second protrusion 212, and the shapes and sizes of the three bosses 213 are not identical. In this embodiment, the surfaces of the first protrusion 211, the second protrusion 212, and the bosses 213 are all arc surfaces. In actual production, the structures can be respectively formed by introducing masks with different transmittances. For example, the transmittance of the mask plate corresponding to the groove may be the highest, the transmittance of the mask plate corresponding to the shorter boss 213 may be the next, and the transmittance of the mask plate corresponding to the taller first protrusion 211, second protrusion 212, the boss 213 may be the lowest, and the manufacturing process is simple.

When the surface of the first protrusion 211, the second protrusion 212, or the boss 213 away from the pixel definition structure is an arc surface, compared with the planar structure, the amount of the organic common layer that can be accommodated above the curve surface is limited, and the impedance of the corresponding organic common layer is relatively high, which is beneficial to reducing the leakage current from the second opening K2 to the first opening K1, and improving the light stealing phenomenon of the sub-pixels. In addition, when the surfaces of the first protrusion 211, the second protrusion 212, and the boss 213 away from the pixel definition structure 21 are arc surfaces, the routing path of the organic light emitting layer and the transmission path of the electrical signals can be extended, the amount of the electrical signals transmitted from the first opening K1 to the second opening K2 can be reduced, and the light stealing phenomenon can be avoided.

It should be noted that, FIG. 11 only shows that three bosses 213 are introduced between the first protrusion 211 and the second protrusion 212, and the heights of the three bosses 213 are not identical. The present disclosure does not limit the number, shape, and thickness of the bosses 213 included between the first protrusion 211 and the second protrusion 212.

Figure 12:
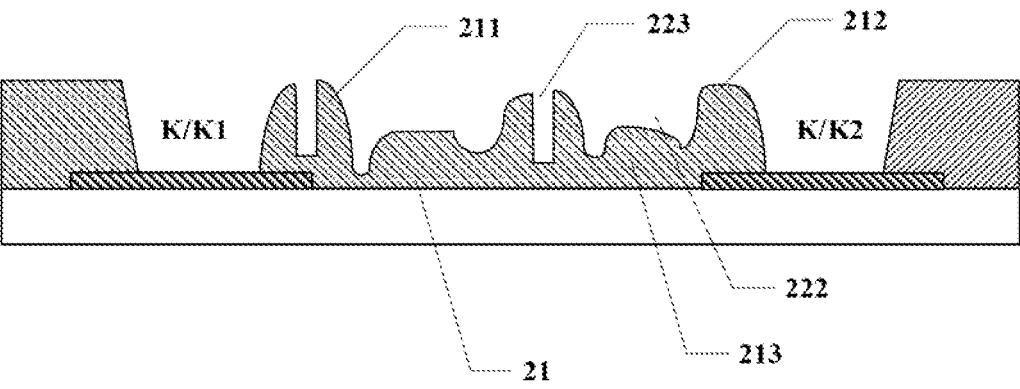
FIG. 12 is another schematic structural diagram of a non-pixel area between two adjacent pixel areas.

FIG. 12 is another schematic structural diagram of a non-pixel area between two adjacent pixel areas. In some embodiments, at least the first protrusion 211, the second protrusion 212, and the boss 213 may include a recess 223. The recess 223 may be recessed from the surface of the protrusion or the boss 213 away from the pixel definition structure 21 toward the pixel definition structure 21, and the depth of the recess 223 may be greater than the depth of the second groove 222.

This embodiment shows a technical solution in which the recess 223 is introduced on the first protrusion 211 and the second protrusion 212, but the actual position of the recess 223 is not limited in the present disclosure, and the recess 223 may also be provided on the 213. When at least one of the first protrusion 211, the second protrusion 212, and the boss 213 is provided with the recess 223, the recess 223 may also accommodate the organic common layer, which extends the routing path of the organic common layer and the transmission path of the electrical signal, which is beneficial to further reducing the amount of the organic common layer that can be accommodated on the upper surfaces of the first protrusion 211, the second protrusion 212, and the boss 213. In this way, the impedance of the organic common layer in these areas can be increased, thereby further reducing the leakage from the second area to the first area, and avoiding the light stealing phenomenon.

In this embodiment, the depth of the recess 223 may be greater than the depth of the second groove 222 between the first protrusion 211 and the boss 213, between the boss 213 and the boss 213, and between the second protrusion 212 and the boss 213 to increase the amount of organic common layer that can be accommodated in the recess 223, and to increase the step difference between the top and bottom of the recess 223. In this way, the possibility of disconnection of the organic common layer at the top of the recess 223 is increased, which is beneficial to blocking the transmission path of leakage current and effectively avoiding the light stealing phenomenon of the sub-pixels.

In some embodiments, the inner diameter of the opening of the recess 223 may be less than 2 μm. While the depth of the recess 223 may be greater than the depth of the second groove 222, it is also necessary to ensure that it is less than the height of the first protrusion 211, the second protrusion 212, or the boss 213 to prevent the recess 223 from penetrating through the first protrusion 211, the second protrusion 212, or the boss 213. For the depth of the second groove 222, reference can be made to the depth of the second groove 222 described in the foregoing embodiments, for example, the depth of the second groove 222 may be between 0.7 μm to 1.3 μm.

In some embodiments, the first protrusion 211, the second protrusion 212, and the boss 213 may be formed by introducing an organic mask combined with an exposure process, and the recess 223 may be formed by introducing a hard mask layer combined with an etching process. The detailed manufacturing process will be described in the following embodiments.

The embodiment shown in FIG. 12 only shows the technical solution in which the recess 223 is provided on the first protrusion 211 and one boss 213, however, the position of the recess 223 is not limited in the present disclosure.

Figure 13:
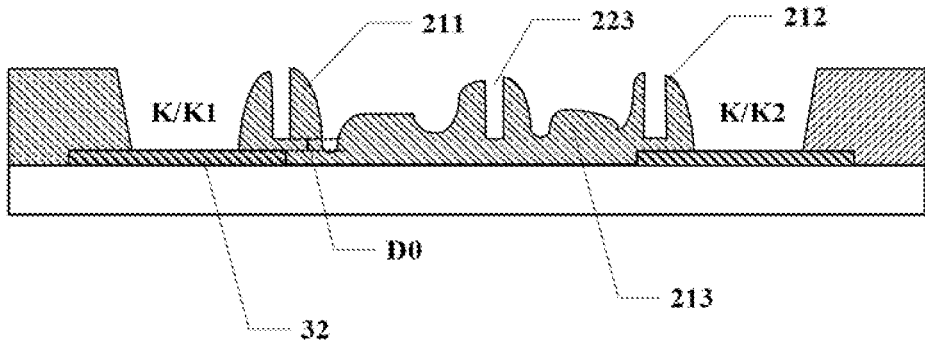
FIG. 13 is another schematic structural diagram of a non-pixel area between two adjacent pixel areas.

FIG. 13 is another schematic structural diagram of a non-pixel area between two adjacent pixel areas. In some embodiments, the heights of the first protrusion 211 and the second protrusion 212 may be greater than or equal to the height of the boss 213, and both the first protrusion 211 and the second protrusion 212 may be provided with a recess 223.

More specifically, this embodiment shows a technical solution in which the first protrusion 211, the second protrusion 212, and one boss 213 are all provided with the recess 223. By increasing the number of recesses 223, the amount of the organic common layer that the recesses 223 can accommodate is increased, thereby reducing the amount of organic common layer that can be accommodated on the first protrusion 211, the second protrusion 212, and the boss 213. In addition, the effect of disconnecting the organic common layer at the connection between the first protrusion 211, the second protrusion 212, and the recess 223 to block the signal transmission path may also be achieved, thereby improving the light stealing phenomenon of the sub-pixels.

In some embodiments, the height of the first protrusion 211 and the second protrusion 212 may be greater than or equal to the height of the boss 213. When setting the recess 223, in addition to setting the recess 223 on the first protrusion 211 and the second protrusion 212, the recess 223 may also be set on a higher boss 213, thereby increasing the amount of the organic common layer that can be accommodated in the recess 223 as a whole. Of course, in some other embodiments of the present disclosure, in addition to setting the recess 223 on the first protrusion 211 and the second protrusion 212, the recess 223 may also be set on all the bosses 213 to further increase the organic common layer that can be accommodated in the recess 223 as a whole, and reduce the amount of the organic common layer accommodated on the upper surfaces of the first protrusion 211, the second protrusion 212, and the bosses 213, thereby further reducing the light stealing phenomenon.

Referring to FIG. 13, in some embodiments, the light emitting device layer 30 may further include an anode 32. The anode 32 may be located on the side of the pixel definition structure 21 facing the substrate 00. In the direction perpendicular to the substrate 00, the distance between the surface of the anode 32 away from the substrate 00 and the bottom surface of the recess 223 may be D0, and 0.7 µm≤D0≤1 µm.

When the recess 223 is formed on at least one of the first protrusion 211, the second protrusion 212, and the boss 213, the recess 223 cannot penetrate the pixel definition structure 21, thereby avoiding exposing the anode 32 and affecting the anode 32. If the distance between the anode 32 and the recess 223 is too short, such as less than 0.7 µm, the anode 32 is likely to be exposed during the process of etching the recess 223. When the anode 32 is electrically connected to the organic common layer, the anode 32 will interfere with the signal of the anode 32 and affect the light emitting reliability of the display panel. If the distance between the anode 32 and the recess 223 is too long, such as greater than 1 µm, the depth of the recess 223 may be too shallow, and the amount of the organic common layer that can be accommodated in the recess 223 is limited, thereby affecting improvement on the leakage current. Therefore, in this embodiment, the distance between the anode 32 and the recess 223 can be set to 0.7 µm≤D0≤1 µm, which can not only protect the anode 32 to prevent the anode 32 from being exposed to the depth of the recess 223 and affect the reliability of light emission, but also ensure that the recess 223 has a certain depth to accommodate more organic common layers, and increase the step difference between the top and bottom of the groove, thereby effectively improving the light stealing phenomenon caused by leakage.

Figure 14:
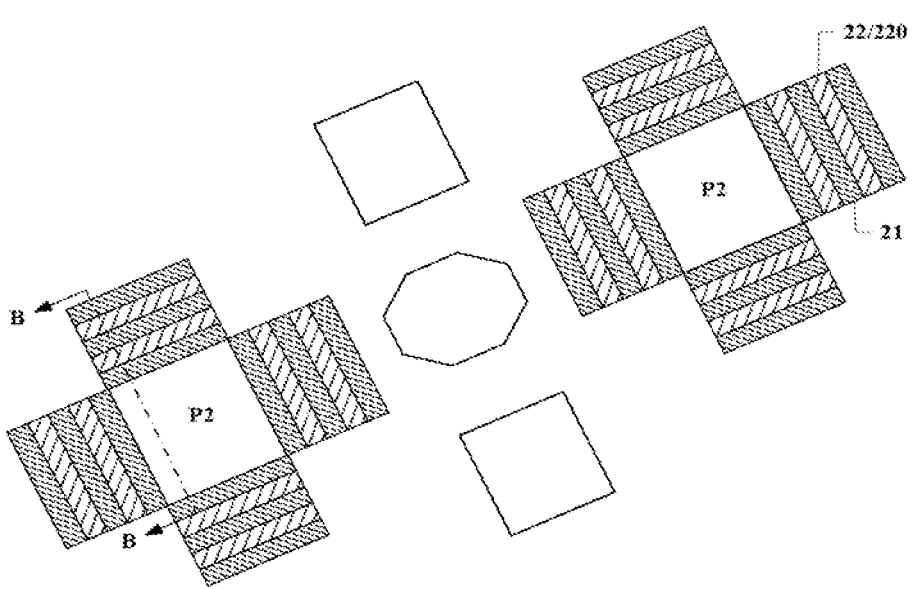
FIG. 14 is a diagram showing a relative positional relationship between a light emitting device of a second color and a blocking part according to an embodiment of the present disclosure.
Figure 15:
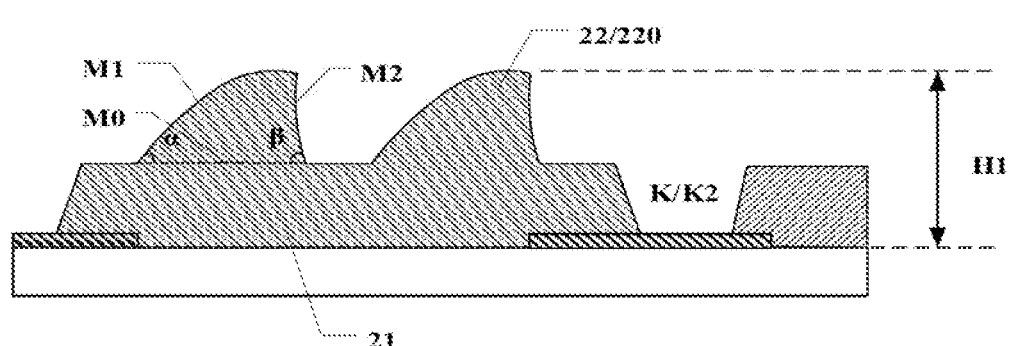
FIG. 15 is a cross-sectional view of FIG. 14 along line B-B.

FIG. 14 is a diagram showing a relative positional relationship between the second color light emitting device P2 and the blocking part 22 according to an embodiment of the present disclosure, and FIG. 15 is a cross-sectional view of FIG. 14 along line B-B. In some embodiments, the blocking part 22 may be arranged around the second color light emitting device P2. It should be noted that, in order to clearly illustrate the relative positional relationship between the blocking part 22 and the second color light emitting device P2, FIG. 14 uses different fillings for the blocking part 22 and the pixel definition structure 21, but in fact, the blocking part 22 and the pixel definition structure 21 can be made of the same material.

When the display panel includes at least three light emitting devices with different color, the turn-on voltage of the second color light emitting device P2 may be assumed to be the largest. At this time, when the blocking part 22 is provided between the second color light emitting device P2 and other adjacent light emitting devices, the second color light emitting device P2 may be surrounded with the blocking part 22. In this way, the blocking part 22 can block or reduce the leakage of the electrical signal provided by the second color light emitting device P2 to any other light emitting devices adjacent to the second color light emitting device P2, which is beneficial to improving the light stealing phenomenon of the sub-pixels. When the blocking part 22 surrounds the second color light emitting device P2, in the protrusion of the blocking part 22 adjacent to the second color light emitting device P2, the second sidewall M2 of the protrusion may be adjacent to the second color light emitting device P2, and the first sidewall M1 of the protrusion may be located on the side of the second sidewall M2 away from the second color light emitting device P2. The angle β between the second sidewall M2 and the first bottom surface M0 may be larger than the angle α between the first sidewall M1 and the first bottom surface M0. That is, the sidewall with a steeper slope in the protrusion may be adjacent to the second color light emitting device P2, and the sidewall with a gentle slop may be farther away from the second color light emitting device P2 than the sidewall with a steeper slope. The second sidewall M2 adjacent to the second color light emitting device P2 in the protrusion 220 may be set to be relatively steep, such that the step difference between the top of the protrusion at the position of the second sidewall M2 and the first bottom surface M0 can be relatively large, or only a small thickness of the organic common layer can be retained at the top position. In this way, when the driving voltage supplied to the second color light emitting device P2 reaches the top position corresponding to the second sidewall M2, it cannot be further transmitted to other light emitting devices adjacent to the second color light emitting device P2. Or, because the thickness of the organic common layer at the top position is limited and the impedance is relatively large, only a small voltage may be transmitted to other light emitting devices adjacent to the second color light emitting device P2, but not enough to drive other light emitting devices adjacent to the second color light emitting device P2 to emit light. Therefore, the light stealing phenomenon of the sub-pixels can be effectively improved, which is beneficial to improving the display effect of the display panel.

Figure 16:
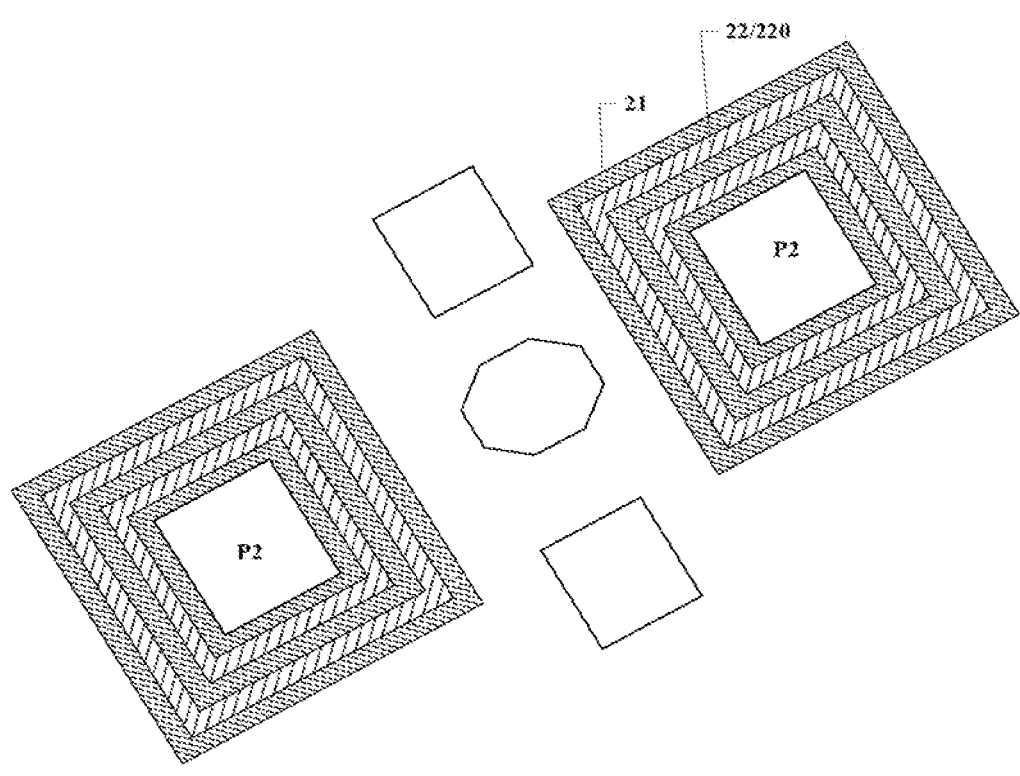
FIG. 16 is a diagram showing the relative positional relationship between the light emitting device of the second color and the blocking part according to an embodiment of the present disclosure.

FIG. 16 is a diagram showing a relative positional relationship between the second color light emitting device and the blocking part 22 according to an embodiment of the present disclosure. In some embodiments, the protrusion on the blocking part 22 may be a closed ring structure. It should be noted that, in order to clearly illustrate the relative positional relationship between the blocking part 22 and the second color light emitting device P2, FIG. 16 uses different fillings for the blocking part 22 and the pixel definition structure 21, but in fact, the blocking part 22 and the pixel definition structure 21 can be made of the same material.

Referring to FIG. 15 and FIG. 16, this embodiment shows a technical solution in which the blocking part 22 is provided around the second color light emitting device P2, and the protrusion on the blocking part 22 is a closed ring structure. In this embodiment, the same blocking part 22 includes two protrusions 220, however, the number of protrusions 220 included in the protrusion 220 is not limited in the present disclosure. In some other embodiments of the present disclosure, the blocking part 22 may also include a plurality of protrusions 220.

When the protrusion 220 is a closed ring structure, and two protrusions 220 are arranged between two openings K, it is equivalent to increasing the size of the groove between the protrusions. In this way, the amount of the organic common layer that can be accommodated in the groove can be increased to reduce the amount of the organic common layer at the top of the protrusion 220. Further, the impedance of this part of the organic common layer is increased to reduce the leakage between the two adjacent openings, which is beneficial to improving the light stealing phenomenon of the sub-pixels. In the technical solution of setting the protrusion as a closed ring structure, after the electrical signal provided to the second color light emitting device is blocked by the closed ring structure, the leakage current from all directions can be reduced, which is beneficial to improving the light stealing phenomenon of the sub-pixels.

Referring to FIG. 2, in some embodiments, the blocking part 22 may be made of the same material as the pixel definition structure 21. When manufacturing the display panel, the same film layer may be processed to form the pixel definition structure 21 and the blocking part 22, which is beneficial to simplifying the overall manufacturing process of the display panel and improving the production efficiency of the display panel. The process of forming the pixel definition structure 21 and the blocking part 22 using the same film layer will be described in detail in the following embodiments.

FIG. 17 is a flowchart of a display panel manufacturing method according to an embodiment of the present disclosure. Based on the same invention concept, the present disclosure also provides a display panel manufacturing method. The method will be described in detail below.

Figure 18:
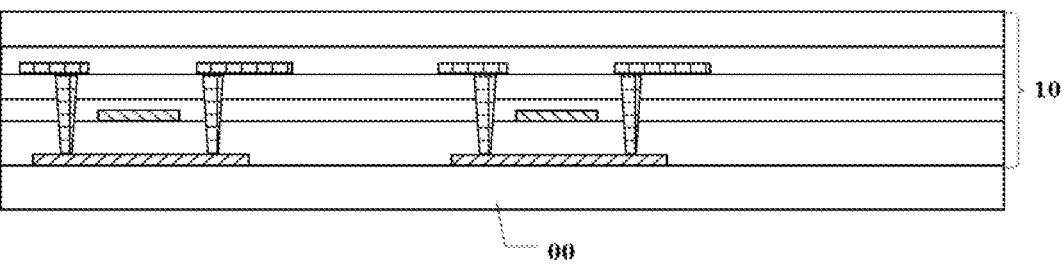
FIG. 18 is a schematic structural diagram of forming an array layer on a substrate in the display panel according to an embodiment of the present disclosure.

S01, providing a substrate 00, and forming an array layer 10 on the substrate 00. For detail, reference can made to FIG. 18, which is a schematic structural diagram of forming an array layer 10 on the substrate 00 in the display panel according to an embodiment of the present disclosure.

Figure 19:
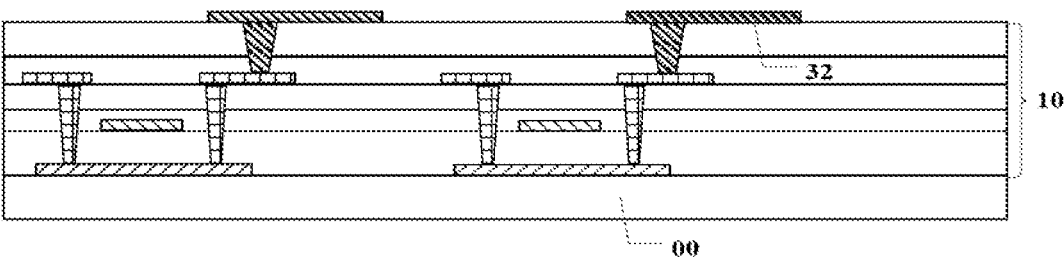
FIG. 19 is a schematic structural diagram of forming an anode on the array layer.

S02, forming an anode 32 on the side of the array layer 10 away from the substrate 00, the anode 32 being electrically connected to the array layer 10. For detail, reference can made to FIG. 19, which is a schematic structural diagram of forming the anode 32 on the array layer 10.

Figure 20:
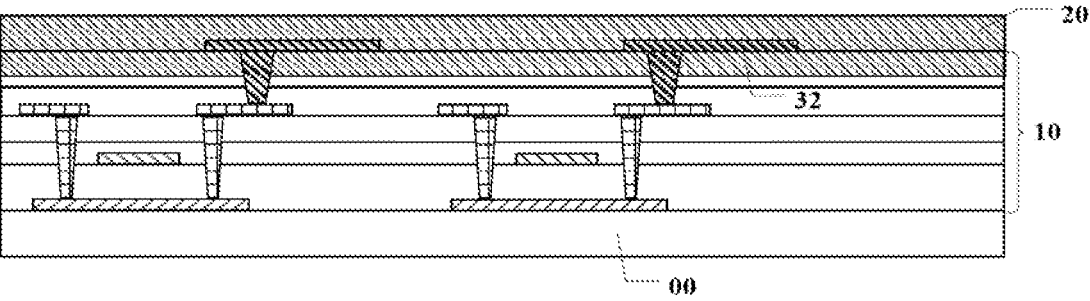
FIG. 20 is a schematic structural diagram of forming a pixel definition layer on a side of the anode away from the substrate.

S03, forming a pixel definition layer 20 on the side of the anode 32 facing away from the substrate 00. For detail, reference can made to FIG. 20, which is a schematic structural diagram of forming the pixel definition layer 20 on the side of the anode 32 facing away from the substrate 00.

Figure 21:
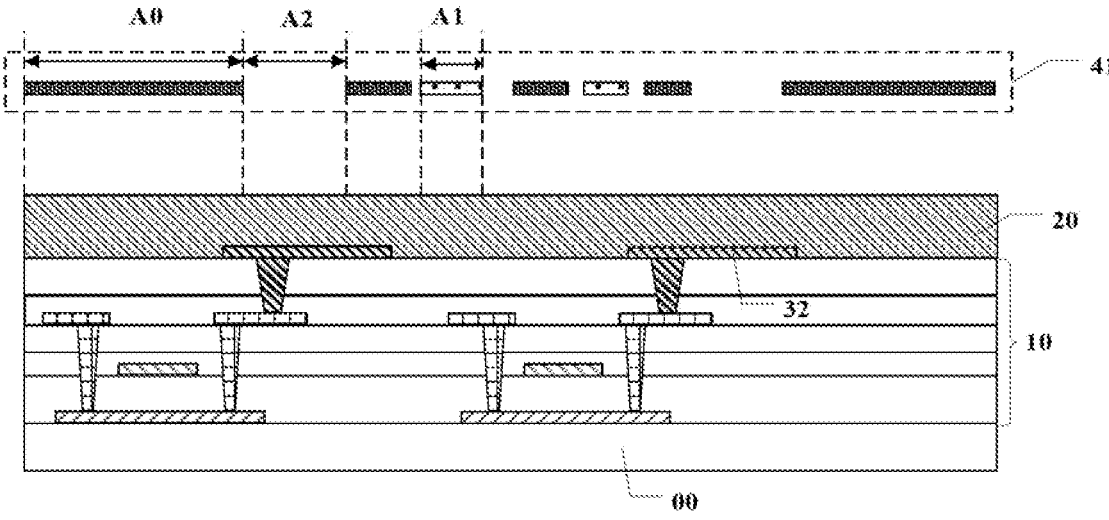
FIG. 21 is a schematic structural diagram of arranging a first mask on a side of the pixel definition layer.

S04, arranging a first mask 41 on the side of the pixel definition layer 20 away from the substrate 00, the first mask 41 including at least a fully transparent area A2, a semi-transparent area A1, and an opaque area A0. For detail, reference can made to FIG. 21, which is a schematic structural diagram of arranging the first mask 41 on one side of the pixel definition layer 20.

Figure 22:
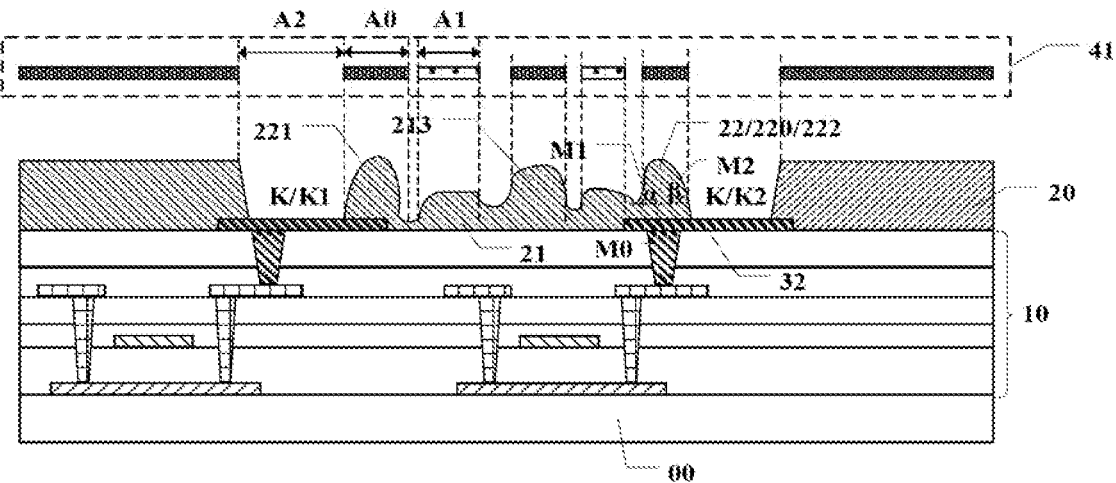
FIG. 22 is a schematic structural diagram of forming a pixel definition structure and the blocking part on the pixel definition layer.

S05, perform exposure processing. FIG. 22 is a schematic structural diagram of forming the second protrusion 212 and the blocking part 22 on the pixel definition layer 20. An opening is formed in the corresponding fully transparent area A2 on the pixel definition layer 20 to expose the anode 32, and the pixel definition structure 21 and the blocking part 22 are formed in the opaque area A0 and the semi-transparent area A1. The blocking part 22 may be disposed on the side of the pixel definition structure 21 away from the substrate 00. The blocking part 22 may include at least one protrusion 220, and the protrusion 220 may include a first bottom surface M0 close to the substrate 00, and opposite first sidewall M1 and second sidewall M2. The angle between the first sidewall M1 and the first bottom surface M0 may be $\alpha$, and the angle between the second sidewall M2 and the first bottom surface M0 may be $\beta$, and one of $\alpha$ and $\beta$ may be larger than the other.

Figure 23:
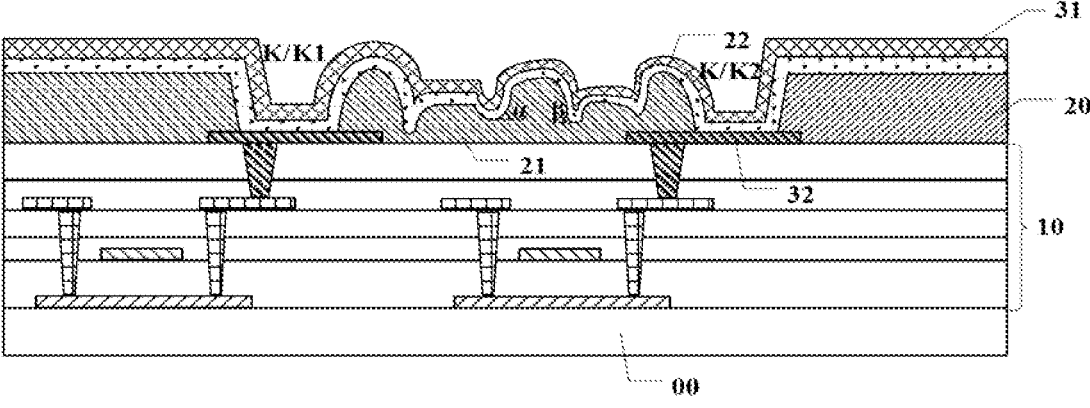
FIG. 23 is a schematic structural diagram of forming an organic common layer.

S06, forming the organic common layer 31 at least in the opening of the pixel area. For detail, reference can made to FIG. 23, which is a schematic structural diagram of forming the organic common layer 31.

In some embodiments, after forming the organic common layer 31, the process of forming a cathode 33 and an encapsulation layer on the side of the organic common layer 31 away from the substrate 00 may also be performed. The light emitting device layer 30 may be encapsulated by the encapsulation layer to isolate external water and oxygen from the light emitting device layer 30 to prevent water and oxygen from affecting the performance of the light emitting device layer 30.

Figure 24:
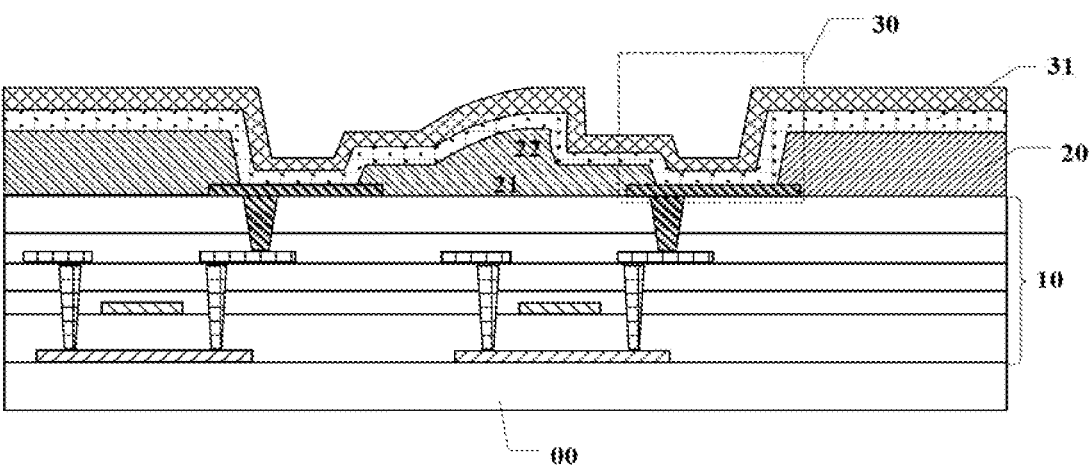
FIG. 24 is another schematic structural diagram of forming the pixel definition structure and the blocking part on the pixel definition layer.

It should be noted that the above embodiment only shows a technical solution in which the first protrusion 211 and the second protrusion 212 are formed in the same blocking part 22 and three bosses 213 are formed between the first protrusion 211 and the second protrusion 212, but the method of forming the blocking part 22 is not limited to the structure shown in FIG. 22. That is, there is no limit on the number of protrusions and bosses 213 included in the blocking part 22. For example, the blocking part 22 may include one protrusion 220. Referring to FIG. 24 is another schematic structural diagram of forming the pixel definition structure 21 and the blocking part 22. In some embodiments, for the structure shown in FIG. 24, in the non-pixel area between two adjacent openings K, along the arrangement direction of the two openings, the width of a single fully transparent area A2 may be set to 1 μm to 2.8 μm and the opaque area may be set to 2.5 μm to 10 μm. In addition, along the direction perpendicular to the substrate 00, the height of the protrusion in the blocking part 22 may be 1 μm to 1.5 μm, and the height of the pixel definition structure 21 in the semi-transparent area A1 may be 1 μm.

For the structure shown in FIG. 22, in some embodiments, in the non-pixel area between two adjacent openings, along the arrangement direction of the two openings, the width of the fully transparent area A2 between the semi-transparent area A1 and the opaque area A0 may be 2 μm to 2.8 μm. The distance between the highest point of the protrusion and the surface of the pixel definition layer 20 facing the array layer 10, that is, the maximum thickness of the pixel definition layer 20 may be between 1.5 μm to 2.1 μm.

The protrusion formed using the above method may be an asymmetric structure. Along the arrangement direction of two adjacent pixel areas, the protrusion between the two pixel areas may include a first sidewall M1 and a second sidewall M2. The angle between the first sidewall M1 and the first bottom surface M0 may be α, and the angle between the second sidewall M2 and the first bottom surface M0 may be β, α being different from β. When an organic common layer is formed in a pixel area and a non-pixel area, the asymmetric protrusion in the blocking part 22 may extend the routing path of the organic common layer, and reduce the amount of the organic common layer on the side of the protrusion facing away from the substrate 00, and even the organic common layer may be able to cut off on the side of the protrusion facing away from the substrate 00. In this way, the driving current in a certain pixel area may not be able to leak to the adjacent pixel area; or, only a small amount of current sufficient to drive the light emitting device layer 30 to emit light may be transmitted to the adjacent pixel area. In this way, the leakage phenomenon of the display panel can be effectively improved, thereby helping to improve the overall display effect of the display panel.

FIG. 25 is another flowchart of the display panel manufacturing method of a fixed display panel according to an embodiment of the present disclosure. Referring to FIG. 25, in some embodiments, after forming the opening, the pixel definition structure 21 and the blocking part 22, that is, the process of S05 described above, the method may further include the following processes.

Figure 26:
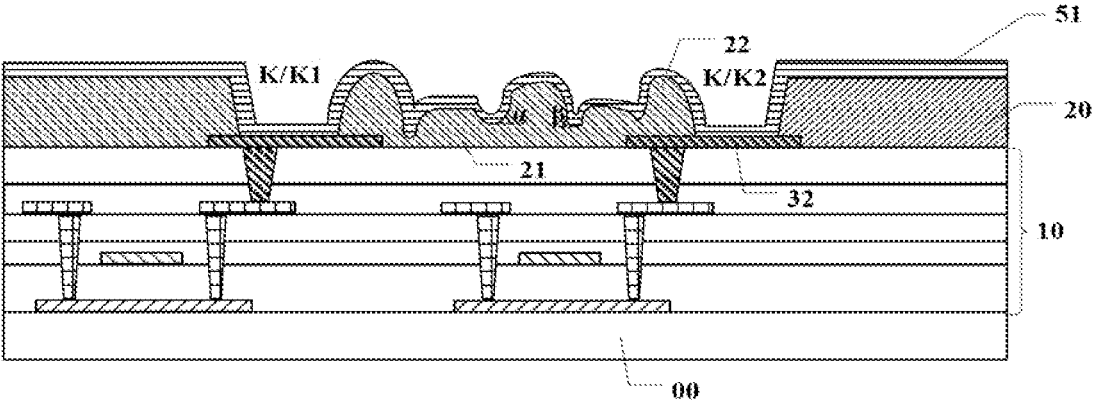
FIG. 26 is a schematic structural diagram of introducing a first hard mask layer.

S10, forming a first hard mask layer 51 on the side of the opening, the pixel definition structure 21, and the blocking part 22 facing away from the substrate 00. For detail, reference can made to FIG. 26, which is a schematic structural diagram of introducing the first hard mask layer 51. In some embodiments, the first hard mask layer 51 may be an IZO layer.

Figure 27:
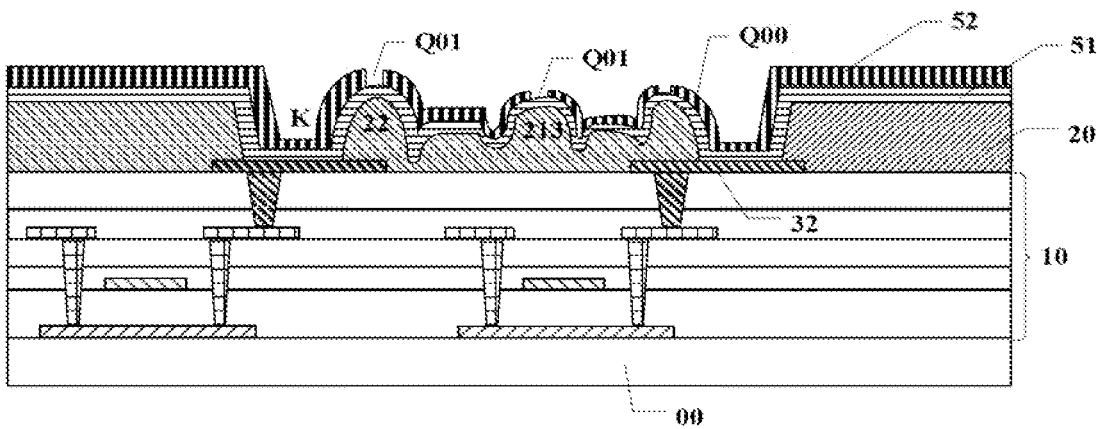
FIG. 27 is a schematic structural diagram of forming a first organic film on the first hard mask layer.

S11, forming a first organic film 52 on the side of the first hard mask layer 51 away from the substrate 00. The first organic film 52 may be processed to form a non-opening area Q00 and an opening area Q01 on the first organic film 52. Along the direction perpendicular to the substrate 00, the opening area Q01 of the first organic film 52 may overlap at least the blocking part 22, and the opening area Q01 may not overlap the opening K. FIG. 27 is a schematic structural diagram of forming the first organic film 52 on the first hard mask layer 51. In some embodiments, the first organic film 52 may be a photoresist. The fully transparent area A2 of the first organic film 52 may not only overlap with the blocking part 22, but also overlap with the boss 213 if the blocking part 22 also includes the boss 213. However, the fully transparent area A2 may not overlap with the groove between the protrusions. In some embodiments, the method of forming the non-opening area Q00 and the opening area Q01 on the first organic film 52 may include introducing a mask plate on the side of the first organic film 52 away from the first hard mask layer 51, a fully transparent area and an opaque area being arranged on the mask plate; and, on the first organic film 52, forming the opening area Q01 at a position corresponding to the fully transparent area of the mask plate, and forming the non-opening area Q00 at a position corresponding to the opaque area of the mask plate by performing an exposure process. In some embodiments, the opening area Q01 may penetrate the first organic film 52 along the thickness direction of the first organic film 52.

Figure 28:
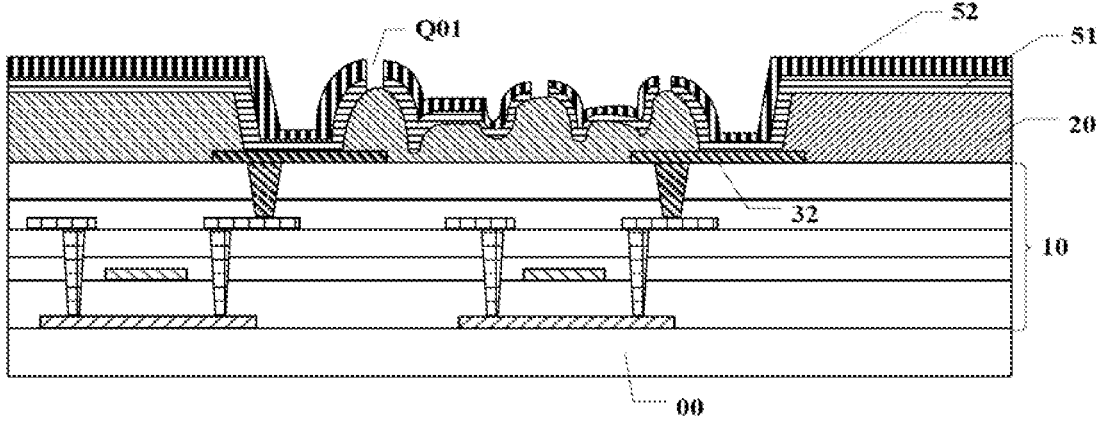
FIG. 28 is a schematic structural diagram of removing part of the first hard mask layer.

S12, removing the first hard mask layer 51 located in the opening area Q01. In some embodiments, the method for removing the first hard mask layer 51 may be wet etching. For detail, reference can made to FIG. 28, which is a schematic structural diagram of removing part of the first hard mask layer 51.

S13, in the opening area Q01, forming the recess 223 on the protrusion by etching. In some embodiments, the etching method may be dry etching. For detail, reference can made to FIG. 29, which is a schematic structural diagram of forming the recess 223 on the protrusion.

Figure 29:
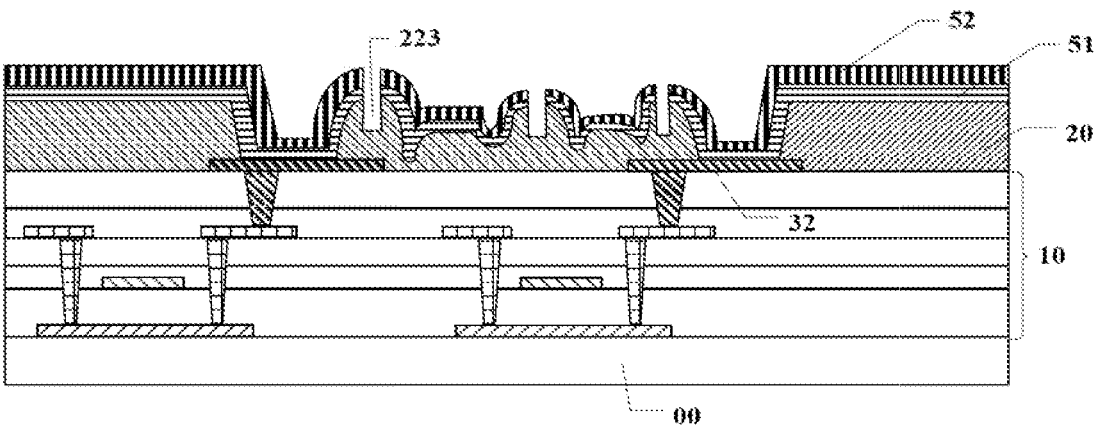
FIG. 29 is a schematic structural diagram of forming a concave on a protrusion.
Figure 30:
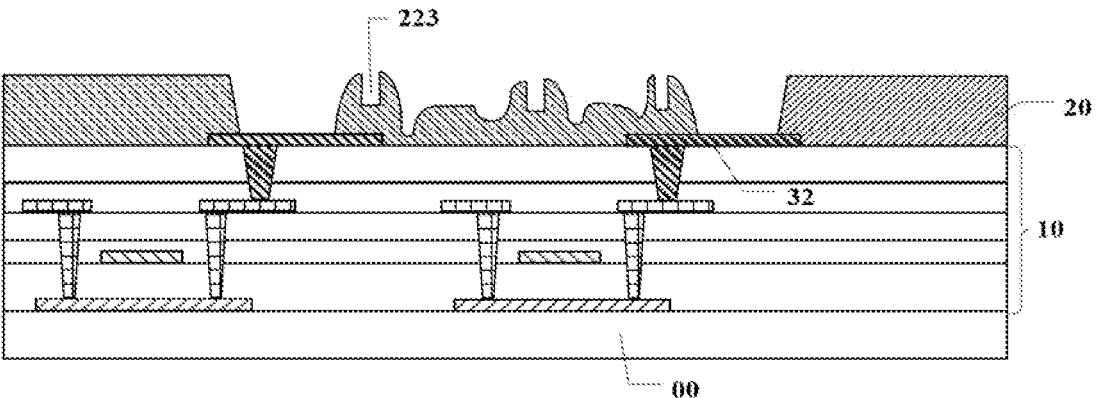
FIG. 30 is a schematic structural diagram of removing the first organic film and the first hard mask layer on the basis of the structure shown in FIG. 29.

S14, sequentially removing the first organic film 52 and the first hard mask layer 51, For detail, reference can made to FIG. 30, which is a schematic structural diagram of removing the first organic film 52 and the first hard mask layer 51 based on the structure shown in FIG. 29.

More specifically, this embodiment further shows the method of forming the recess 223 on the protrusion of the blocking part 22. Before forming the recess 223, the first hard mask layer 51 and the first organic film 52 may be formed on the side of the opening, the pixel definition structure 21, and the blocking part 22 facing away from the substrate 00. After removing the first hard mask layer 51 located at the position of the opening area Q01, under the blocking effect of the first hard mask layer 51 in the non-opening area Q00, dry etching may be performed on the protrusion or the boss 213 in the opening area Q01 to form the recess 223 on the protrusion or the boss 213. The depth of the recess 223 formed by dry etching may be relatively deep, and it may be greater than the depth of the groove in the blocking part 22, that is, the step difference between the top and bottom of the recess 223 may be relatively large. When the organic common layer is subsequently formed, the amount of the organic common layer that can be accommodated in the recess 223 will increase, which is beneficial to extending the routing path of the organic common layer and the transmission path of the electrical signal. The relatively large step difference design of the recess 223 can increase the possibility of disconnection of the organic common layer at the top of the recess 223, which is beneficial to blocking the path of leakage current transmission and effectively avoiding the light stealing phenomenon of the sub-pixels.

Figure 31:
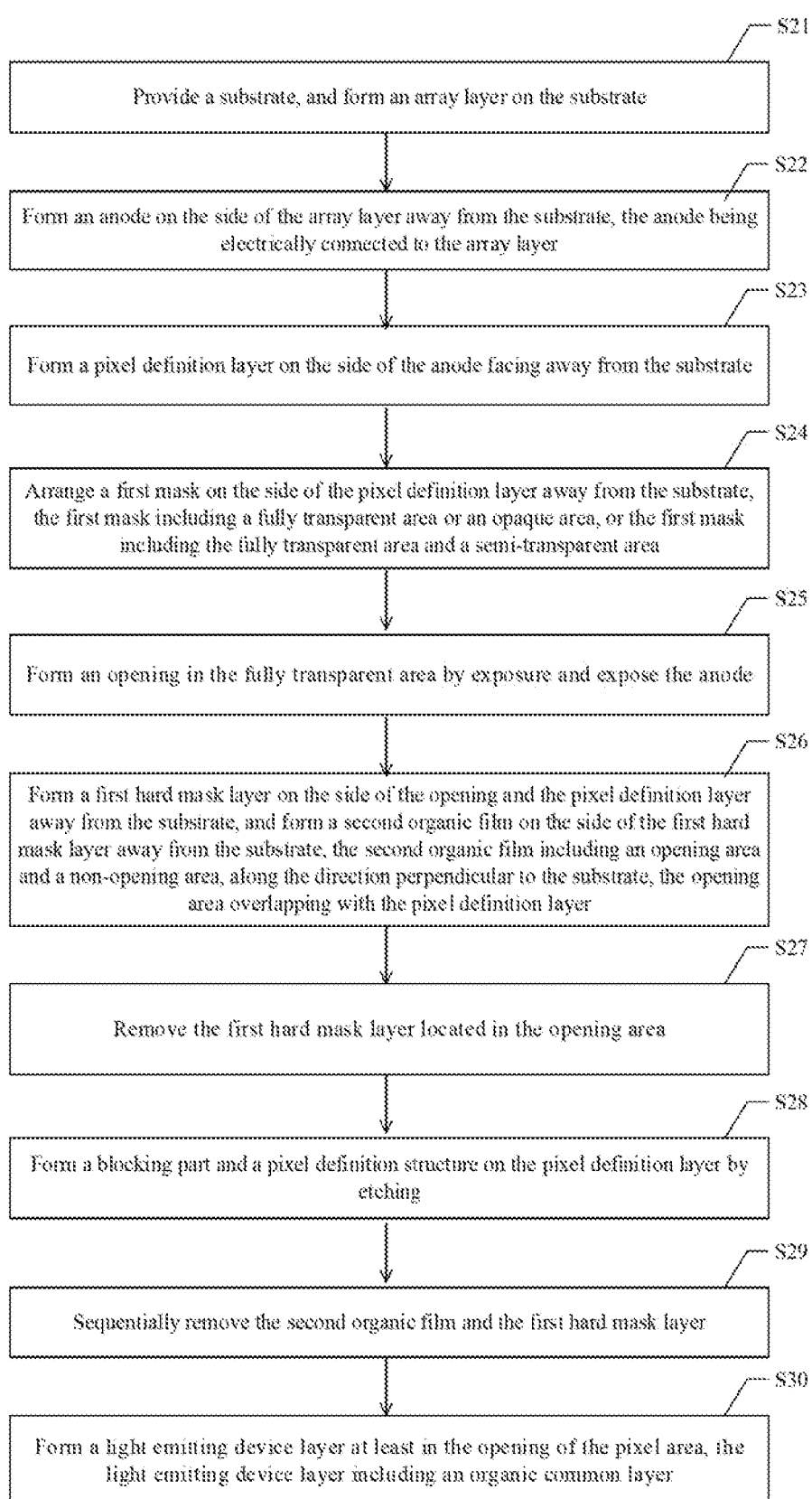
FIG. 31 is another flowchart of the display panel manufacturing method according to an embodiment of the present disclosure.

FIG. 31 is another flowchart of the display panel manufacturing method according to an embodiment of the present disclosure. Based on the same invention concept, the present disclosure also provides a display panel manufacturing method. The method will be described in detail below.

S21, providing a substrate 00, and forming an array layer 10 on the substrate 00. For detail, reference can made to FIG. 18, which is a schematic structural diagram of forming an array layer 10 on the substrate 00 in the display panel according to an embodiment of the present disclosure.

S22, forming an anode 32 on the side of the array layer 10 away from the substrate 00, the anode 32 being electrically connected to the array layer 10. For detail, reference can made to FIG. 19, which is a schematic structural diagram of forming the anode 32 on the array layer 10.

S23, forming a pixel definition layer 20 on the side of the anode 32 facing away from the substrate 00. For detail, reference can made to FIG. 20, which is a schematic structural diagram of forming the pixel definition layer 20 on the side of the anode 32 facing away from the substrate 00.

Figure 32:
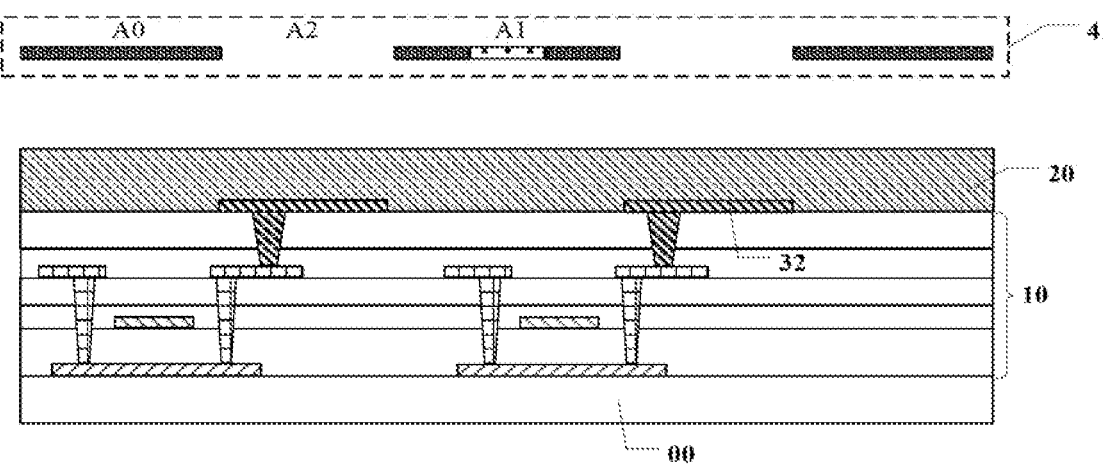
FIG. 32 is a technical solution in which a first mask only includes a full transparent area and an opaque area when the first mask is introduced.
Figure 33:
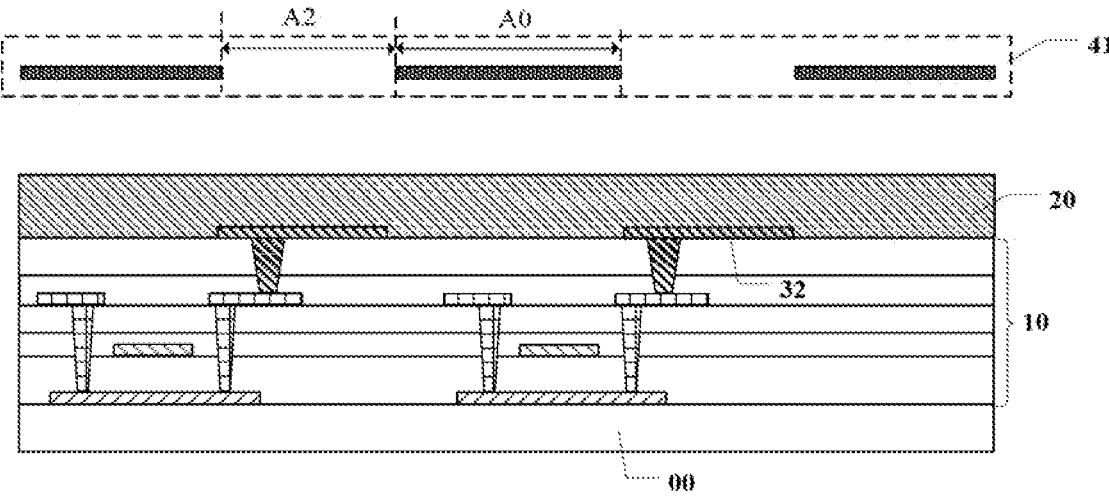
FIG. 33 is a technical solution in which the first mask only includes the fully transparent area and a semi-transparent area when the first mask in introduced.

S24, arranging a first mask 41 on the side of the pixel definition layer 20 away from the substrate 00, that first mask 41 including a fully transparent area A2 and an opaque area A0, or, the first mask 41 including a fully transparent area A2, an opaque area A0, and a semi-transparent area A1. For detail, reference can made to FIG. 32 and FIG. 33. FIG. 32 shows a technical solution in which the first mask 41 only includes the fully transparent area A2 and the opaque area A0 when the first mask 41 is introduced. FIG. 33 shows a technical solution in which the first mask 41 includes the fully transparent area A2, the opaque area A0, and the semi-transparent area A1 when the first mask 41 is introduced.

Figure 34:
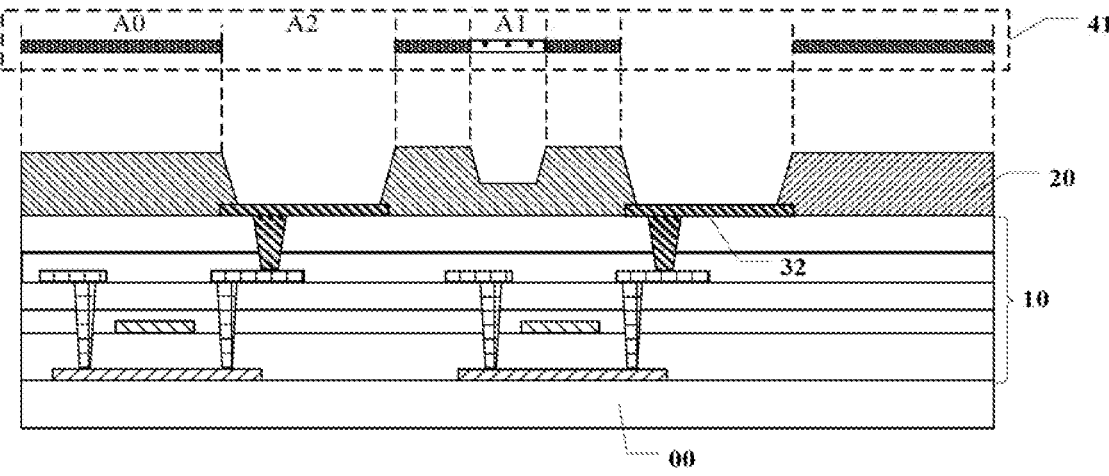
FIG. 34 is a schematic diagram of a structure formed by exposing the first mask structure corresponding to FIG. 32.
Figure 35:
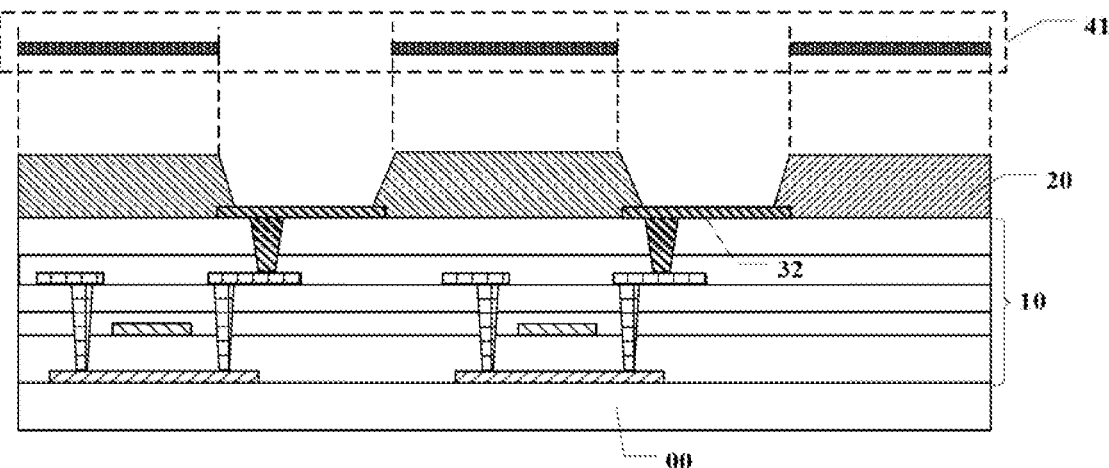
FIG. 35 is a schematic diagram of a structure formed by exposing the first mask structure corresponding to FIG. 33.

S25, forming an opening in the fully transparent area A2 by exposure and exposing the anode 32. For detail, reference can made to FIG. 34 and FIG. 35. FIG. 34 is a schematic structural diagram of a structure formed by exposure using the first mask structure 41 corresponding to FIG. 32. FIG. 35 is a schematic structural diagram of a structure formed by exposure using the first mask structure 41 corresponding to FIG. 33. For the structure shown in FIG. 34, a groove structure may be formed at the position corresponding to the semi-transparent area A1 of the first mask 41.

Figure 36:
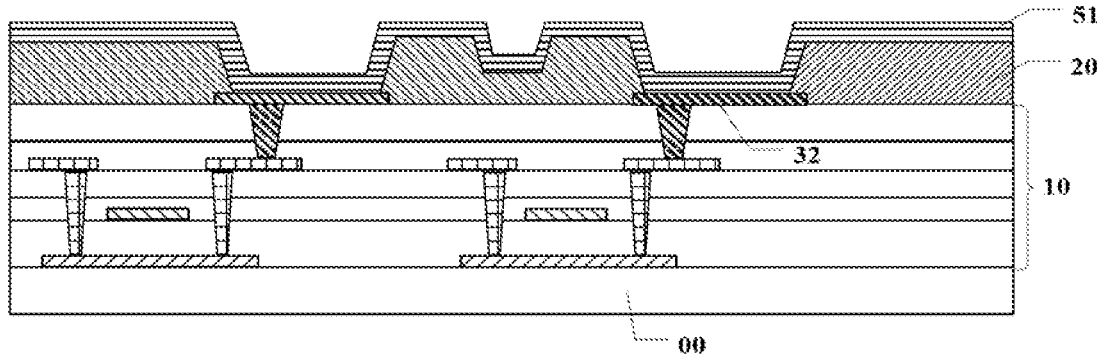
FIG. 36 is a schematic structural diagram of forming the first hard mask layer on the structure shown in FIG. 34.
Figure 37:
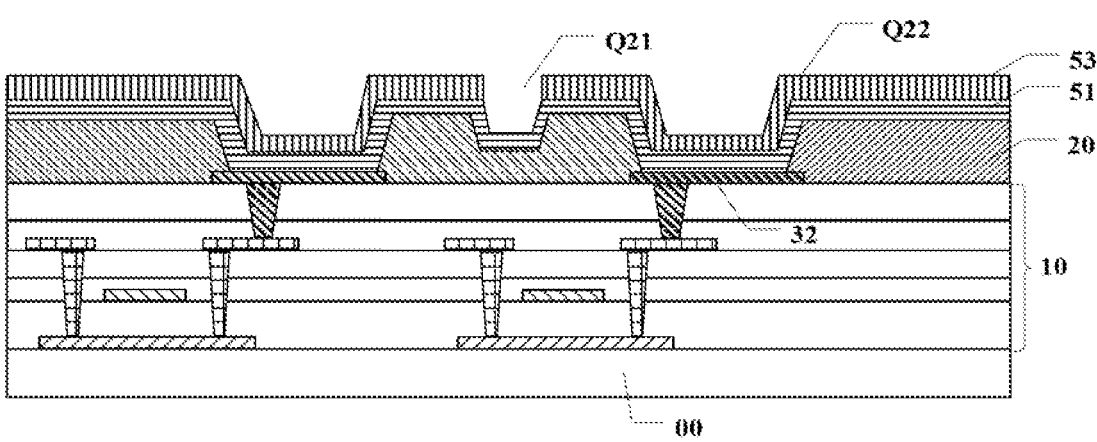
FIG. 37 is a schematic structural diagram of forming a second organic film on the structure shown in FIG. 36.
Figure 38:
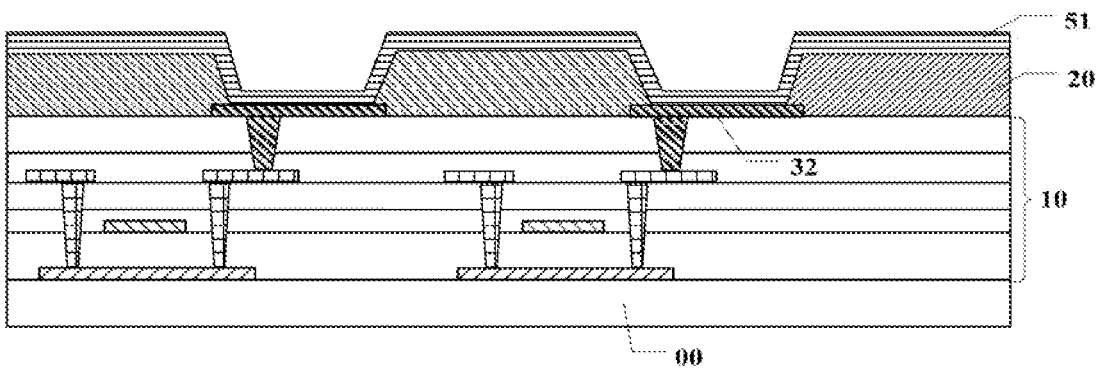
FIG. 38 is a schematic structural diagram of forming the first hard mask layer on the structure shown in FIG. 35.
Figure 39:
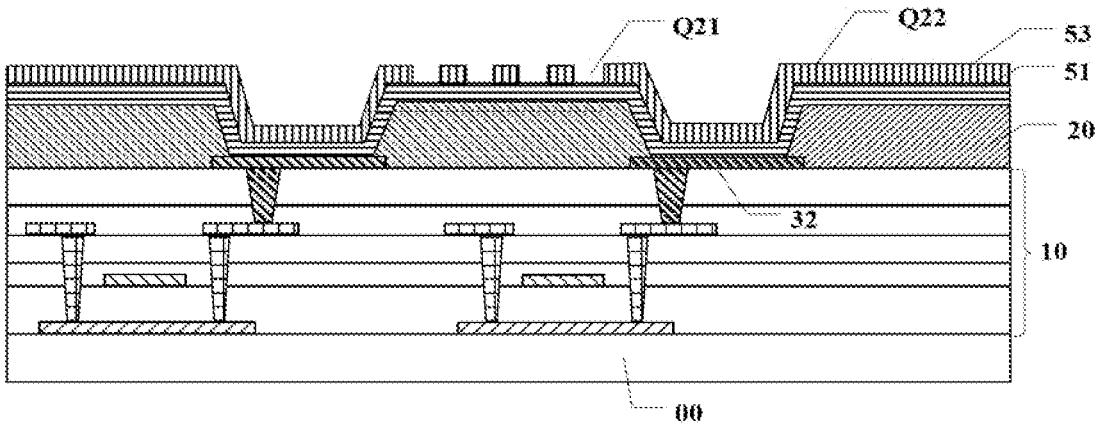
FIG. 39 is a schematic structural diagram of forming the second organic film on the structure shown in FIG. 38.

S26, forming a first hard mask layer 51 on the side of the opening and the pixel definition layer 20 away from the substrate 00, and forming a second organic film 53 on the side of the first hard mask layer 51 away from the substrate 00. The second organic film 53 may be processed to form an opening area Q21 and a non-opening area Q22 on the second organic film 53. Along the direction perpendicular to the substrate 00, the opening area Q21 may only overlap with the pixel definition layer 20. For detail, reference can made to FIG. 36 to FIG. 39. FIG. 36 is a schematic structural diagram of forming the first hard mask layer 51 on the structure shown in FIG. 34. FIG. 37 is a schematic structural diagram of forming the second organic film 53 on the structure shown in FIG. 36. FIG. 38 is a schematic structural diagram of forming the first hard mask layer 51 on the structure shown in FIG. 35. FIG. 37 is a schematic structural diagram of forming the second organic film 53 on the structure shown in FIG. 38. In some embodiments, the first hard mask layer 51 may be an IZO layer, and the second organic film 53 may be a photoresist. The method of forming the opening area Q21 and the non-opening area Q22 on the second organic film 53 may include introducing a mask plate on the side of the second organic film 53 away from the first hard mask layer 51, a fully transparent area and an opaque area being arranged on the mask plate; and, on the second organic film 53, forming the opening area Q21 at a position corresponding to the fully transparent area of the mask plate, and forming the non-opening area Q22 at a position corresponding to the opaque area of the mask plate by performing an exposure process. In some embodiments, the opening area Q21 may penetrate the second organic film 53 along the thickness direction of the second organic film 53.

Figure 40:
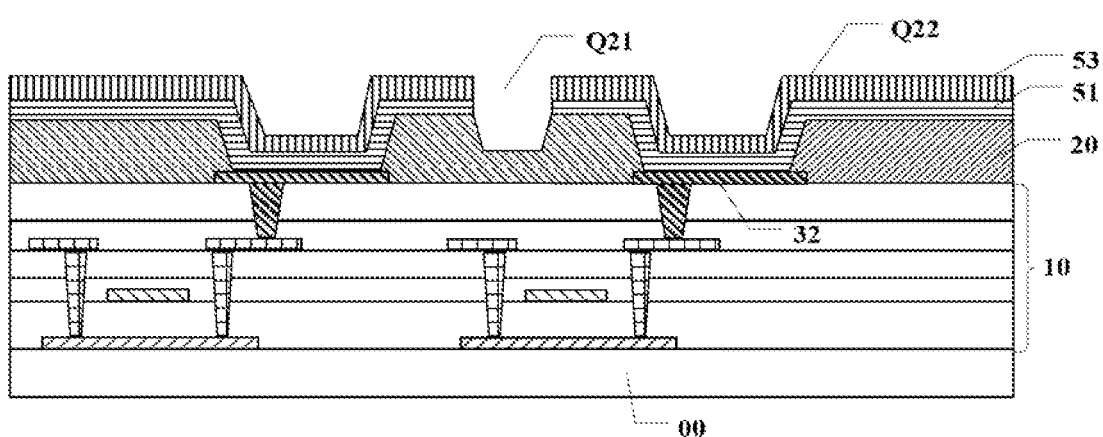
FIG. 40 is a schematic structural diagram of a structure in which the first hard mask layer of an opening area is removed on the basis of the structure shown in FIG. 38.
Figure 41:
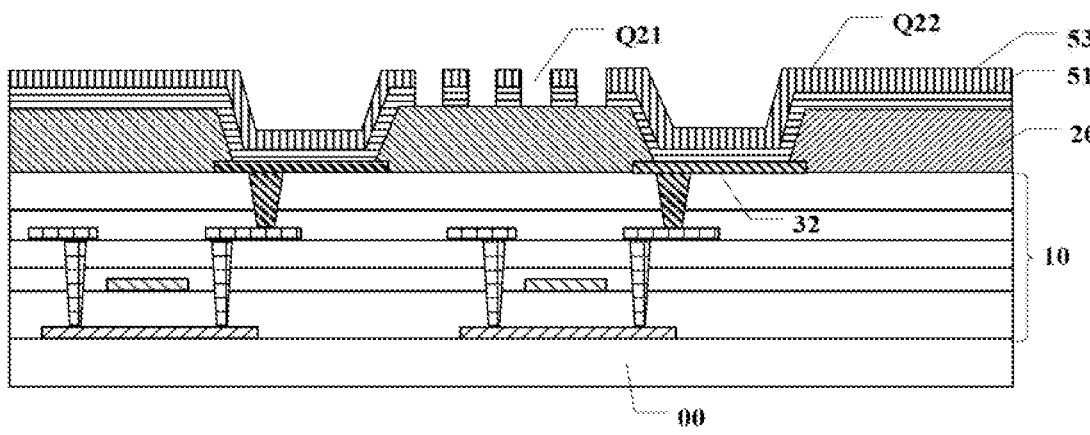
FIG. 41 is a schematic structural diagram of a structure in which the first hard mask layer of the opening area in removed on the basis of the structure shown in FIG. 39.

S27, removing the first hard mask layer 51 located in the opening area Q21. For detail, reference can made to FIG. 40 and FIG. 41. FIG. 40 is a schematic structural diagram of removing the first hard mask layer 51 of the opening area Q21 based on the structure shown in FIG. 38, and FIG. 41 is a schematic structural diagram of removing the first hard mask layer 51 of the opening area Q21 based on the structure shown in FIG. 39. In some embodiments, the method for removing the first hard mask layer 51 may be wet etching.

Figure 42:
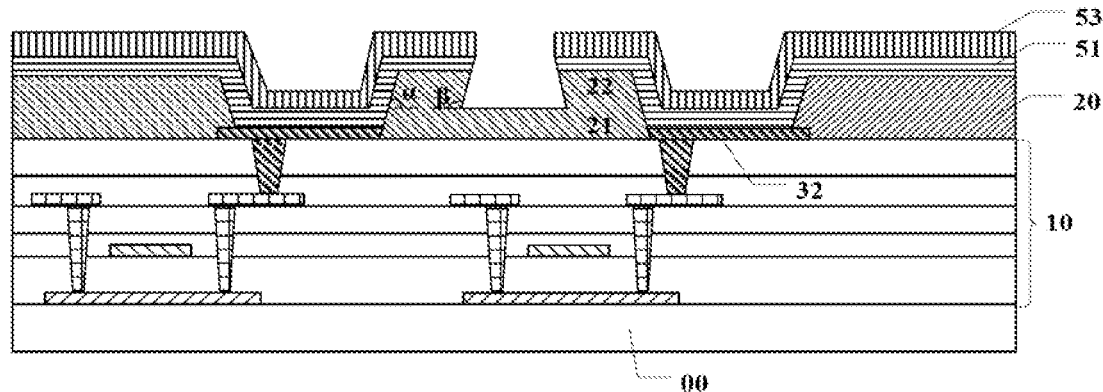
FIG. 42 is a schematic structural diagram of forming the blocking part and the pixel definition structure on the basis of the structure shown in FIG. 40.
Figure 43:
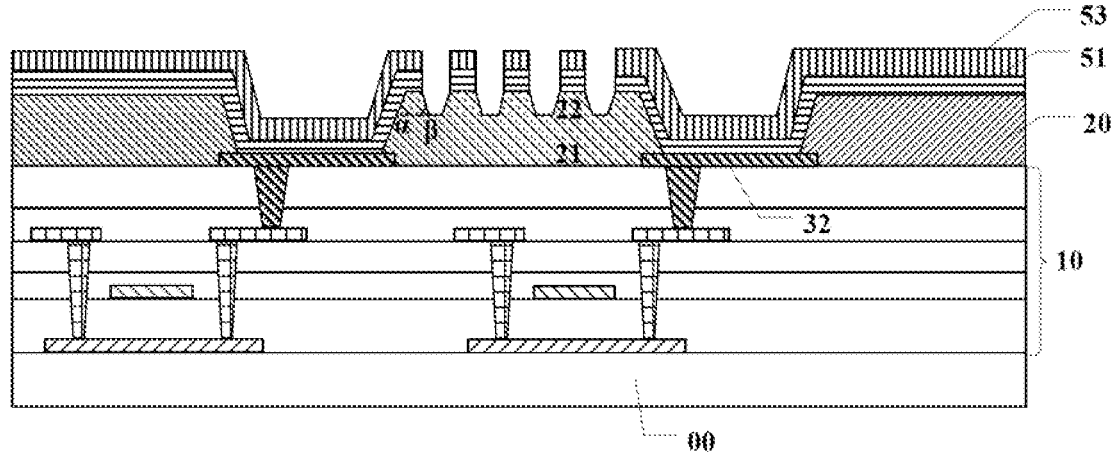
FIG. 43 is a schematic structural diagram of forming the blocking part and the pixel definition structure on the basis of the structure shown in FIG. 41.

S28, forming a blocking part 22 and a pixel definition structure 21 on the pixel definition layer 20 by etching, the blocking part 22 being disposed on the side of the pixel definition structure 21 away from the substrate 00. The blocking part 22 may include at least one protrusion, and the protrusion may include a first bottom surface close to the substrate 00, and opposite first sidewall M1 and second sidewall M2. The angle between the first sidewall and the first bottom surface may be a, and the angle between the second sidewall and the first bottom surface may be β, where one of α and β may be larger than the other. For detail, reference can made to FIG. 4, FIG. 42, and FIG. 43. FIG. 42 is a schematic structural diagram of forming the blocking part 22 and the pixel definition structure based on the structure shown in FIG. 40, and FIG. 43 is a schematic structural diagram of forming the blocking part 22 and the pixel definition structure based on the structure shown in FIG. 41.

Figure 44:
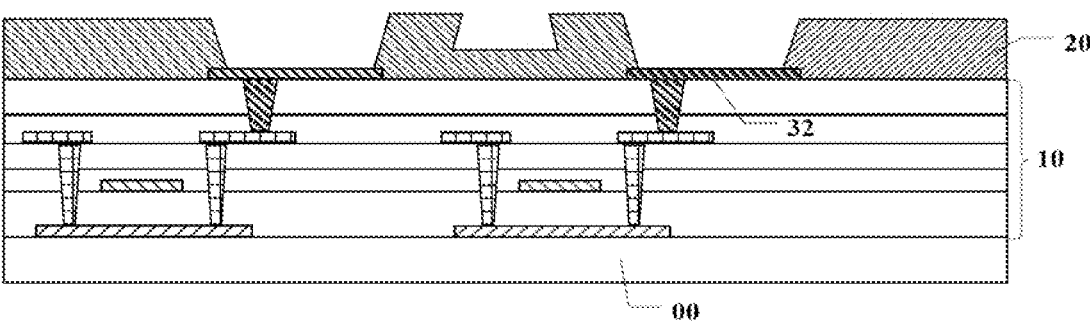
FIG. 44 is a schematic structural diagram after removing the second organic film and the first hard mask layer in the structure shown in FIG. 42.
Figure 45:
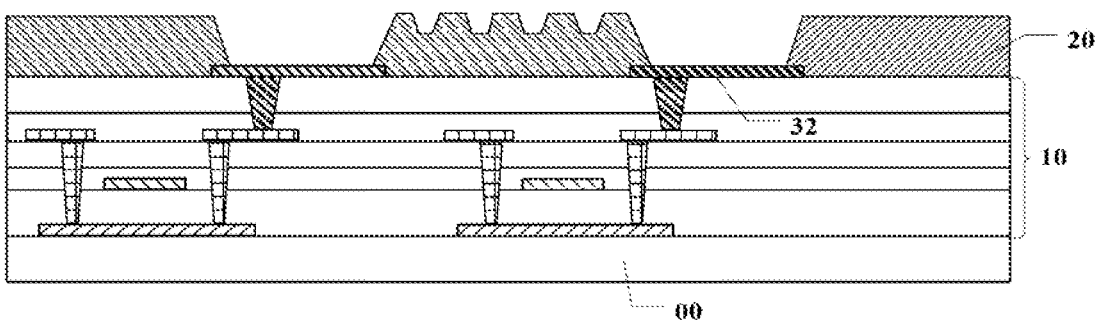
FIG. 45 is a schematic structural diagram after removing the second organic film and the first hard mask layer in the structure shown in FIG. 43.

S29, sequentially removing the second organic film 53 and the first hard mask layer 51. For detail, reference can made to FIG. 44 and FIG. 45. FIG. 44 is a schematic structural diagram of removing the second organic film 53 and the first hard mask layer 51 in the structure shown in FIG. 42, and FIG. 45 is a schematic structural diagram of removing the second organic film 53 and the first hard mask layer 51 in the structure shown in FIG. 43.

Figure 46:
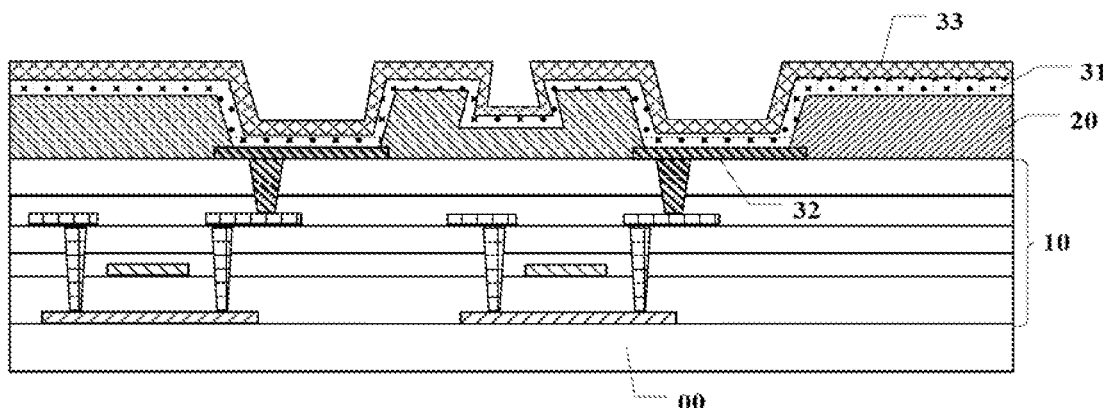
FIG. 46 is a schematic structural diagram of forming the organic common layer on the basis of the structure shown in FIG. 44.
Figure 47:
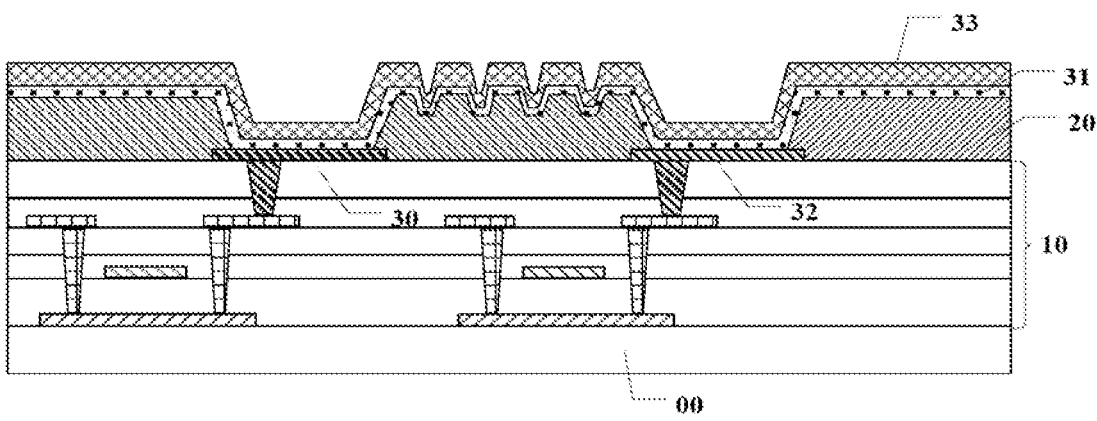
FIG. 47 is a schematic structural diagram of forming the organic common layer on the basis of the structure shown in FIG. 45.

S30, forming an organic common layer 31 at least in the opening of the pixel area. For detail, reference can made to FIG. 46 and FIG. 47. FIG. 46 is a schematic structural diagram of forming the organic common layer based on the structure shown in FIG. 44, and FIG. 47 is a schematic structural diagram of forming the organic common layer based on the structure shown in FIG. 45. It should be noted that the cathode 33 shown in FIG. 46 and FIG. 47 may be formed after the organic common layer 31 is formed. In some embodiments, after forming the cathode, a process for forming an encapsulation layer on the anode may be performed.

More specifically, in the manufacturing method provided by the foregoing embodiments of the present disclosure, after the pixel definition layer 20 and the openings corresponding to the pixels are formed, the first hard mask layer 51 and the second organic film 53 may be sequentially disposed on the pixel definition layer 20. Subsequently, the first hard mask layer 51 located in the fully transparent area A2 may be removed, and the pixel definition layer 20 may be etched formed the fully transparent area A2 under the blocking effect of the first hard mask layer 51. In some embodiments, the etching method may be dry etching. This method is beneficial to increasing the depth of the groove formed on the pixel definition layer 20 by etching, such that the step difference between the top and the bottom of the groove can be relatively large. When the organic common layer is subsequently formed, the amount of the organic common layer that can be accommodated in the groove will increase, which is beneficial to extending the routing path of the organic common layer and the transmission path of the electrical signal. The relatively large step difference design of the groove can increase the possibility of disconnection of the organic common layer at the top of the groove, which is beneficial to blocking the path of leakage current transmission and effectively avoiding the light stealing phenomenon of the sub-pixels.

At the same time, by using the above method, an asymmetric protrusion may also be formed in the pixel definition layer 20. Along the arrangement direction of two adjacent pixel areas, the protrusion between the two pixel areas may include a first sidewall and a second sidewall. The angle between the first sidewall and the first bottom surface may be a, and the angle between the second sidewall and the first bottom surface may be β, α being different from β. When the organic common layer is formed in the pixel area and the non-pixel area, the asymmetric protrusion in the blocking part 22 may extend the routing path of the organic common layer, and reduce the amount of the organic common layer on the side of the protrusion facing away from the substrate 00, and even the organic common layer may be able to cut off on the side of the protrusion facing away from the substrate 00. In this way, the driving current in a certain pixel area may not be able to leak to the adjacent pixel area; or, only a small amount of current sufficient to drive the light emitting device layer 30 to emit light may be transmitted to the adjacent pixel area. In this way, the leakage phenomenon of the display panel can be effectively improved, thereby helping to improve the overall display effect of the display panel.

Figure 48:
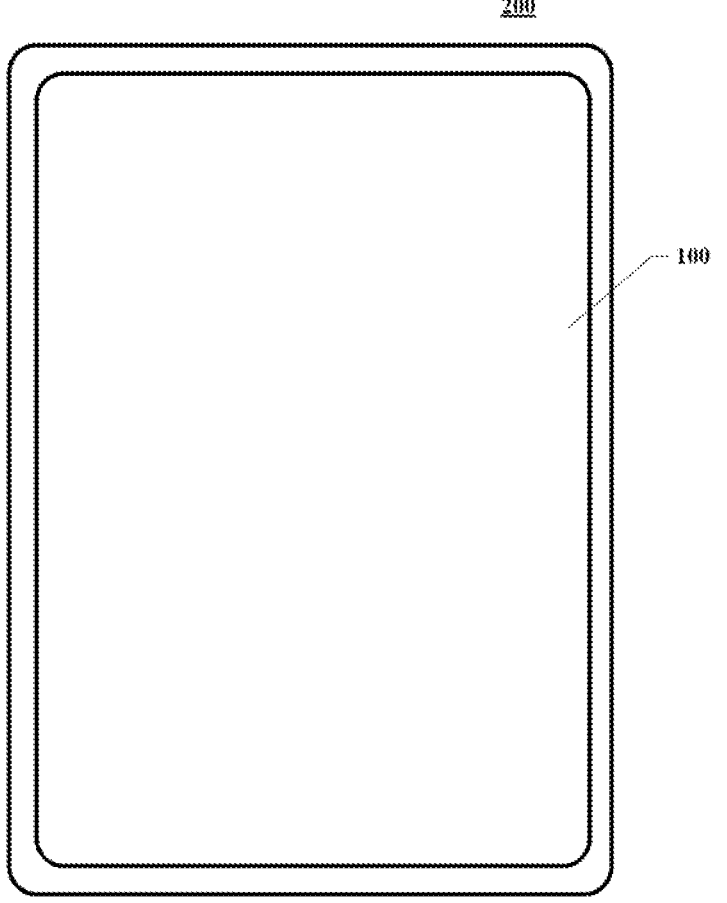
FIG. 48 is a schematic structural diagram of a display device according to an embodiment of the present disclosure.

FIG. 48 is a schematic structural diagram of a display device according to an embodiment of the present disclosure. Based on the same inventive concept, the present disclosure also provides a display device 200 including the display panel 100 provided in the foregoing embodiments of the present disclosure.

It should be understood that the display device provided by the embodiments of the present disclosure may be mobile phone, a tablet, a computer, a television, a vehicle-mounted display device, and other display devices with a display function, which is not limited in the embodiments of the present disclosure. The display device provided by the embodiments of the present disclosure has the beneficial effect of the display panel provided in the embodiments of the present disclosure. For detail, reference can be made to the specific description of the display panel in the foregoing embodiments, which will not be repeated here.

Consistent with the present disclosure, the display panel, the display panel manufacturing method, and the display device provided by the embodiments of the present disclosure at least achieve the following beneficial effects. In the display panel and the display device provided by the embodiments of the present disclosure, or in the display panel formed by the manufacturing method of the present disclosure, the pixel definition layer may include a pixel definition structure located in the non-pixel area and an opening located in the pixel area. The opening may be used to arrange a light emitting device layer. Driven by the current, the light emitting device layer in the opening may emit light to realize the display function. The light emitting device layer may include an organic common layer. When forming the organic common layer, part of the organic common layer may be located in the pixel area, and part of the organic common layer may be located in the non-pixel area. In the present disclosure, a blocking part may be provided on the side of the pixel definition structure away from the substrate. The blocking part may include at least one protrusion, and the protrusion may be an asymmetric structure. The angle between the first sidewall and the first bottom surface of the protrusion may be a, and the angle between the second sidewall and the first bottom surface of the protrusion may be β, α and β being different from each other. When the organic common layer is formed in the pixel area and the non-pixel area, the asymmetric protrusion in the blocking part may extend the routing path of the organic common layer, and reduce the amount of the organic common layer on the side of the protrusion facing away from the substrate, and even the organic common layer may be able to cut off on the side of the protrusion facing away from the substrate. In this way, the driving current in a certain pixel area may not be able to leak to the adjacent pixel area; or, only a small amount of current sufficient to drive the light emitting device layer to emit light may be transmitted to the adjacent pixel area. In this way, the leakage phenomenon of the display panel can be effectively improved, thereby helping to improve the overall display effect of the display panel.

Although some specific embodiments of the present disclosure are described by examples in detail, those skilled in the art should understand that the above examples are only schematic and are not intended to limit the scope of the present disclosure. Those skilled in the art should understand that the above embodiments may be modified without deviating from the scope and spirit of the present disclosure. The scope of the disclosure is defined by the attached claims.

What is claimed is:

1. A display panel, comprising:
   a plurality of pixel areas and at least a non-pixel area located between two adjacent pixel areas;
   a substrate;
   a pixel definition layer located on one side of the substrate, the pixel definition layer including a pixel definition structure located in the non-pixel area and an opening located in the pixel area;
   a blocking part, the blocking part being disposed on a side of the pixel definition structure away from the substrate; and
   a light emitting device layer, the light emitting device layer including an organic common layer, the organic common layer being located on a side of the blocking part away from the substrate, wherein:
   the blocking part includes at least one protrusion, the protrusion including a first bottom surface close to the substrate, a first sidewall, and a second sidewall opposite to the first sidewall, an angle between the first sidewall and the first bottom surface being α, an angle between the second sidewall and the first bottom surface being β, one of α and β being greater than the other;
   the opening includes a first opening and a second opening, the first opening and the second opening being located on both sides of the protrusion and the first opening and the second opening both being adjacent to the protrusion, the first opening and the second opening being arranged along a first direction;
   the protrusion includes a first protrusion and a second protrusion;
   along the first direction, the first protrusion being located between the first opening and the second protrusion, and a first sidewall of the first protrusion being adjacent to the first opening; the second protrusion being located between the second opening and the first protrusion, and a first sidewall of the second protrusion being adjacent to the second opening;
   the blocking part further includes at least one boss, the boss being located between the first protrusion and the second protrusion; and
   second grooves are formed and include a second groove formed between the boss and the first protrusion, and another second groove formed between the boss and the second protrusion.

2. The display panel of claim 1, wherein:
   the opening includes a first opening and a second opening, and the light emitting device layer includes a first color light emitting device and a second color light emitting device, the first opening corresponding to the first color light emitting device, the second opening corresponding to the second color light emitting device, a wavelength of light emitted by the first color light emitting device being greater than a wavelength of light emitted by the second color light emitting device;

the first opening and the second opening being located on both sides of the protrusion and the first opening and the second opening both being adjacent to the protrusion; and along a first direction, the first opening being located on a side of the first sidewall away from the second sidewall, and the second opening being located on a side of the second sidewall away from the first sidewall, the first direction being an arrangement direction of the first opening and the second opening adjacent to the same protrusion, where $\alpha < \beta$.

3. The display panel of claim 2, wherein:

the blocking part is arranged around the second color light emitting device.

4. The display panel of claim 3, wherein:

the protrusion on the blocking part is a closed ring structure.

5. The display panel of claim 1, wherein:

$$0° < \alpha \leq 70° \text{ and } 60° \leq \beta \leq 100°$$

6. The display panel of claim 2, wherein:

the second color light emitting device is a blue light emitting device.

7. The display panel of claim 2, wherein:

along a direction from the first opening to the second opening, a minimum distance between the blocking part and the first opening is D1, a minimum distance between the blocking part and the second opening is D2, and D1<D2.

8. The display panel of claim 1, wherein:

along a direction perpendicular to the substrate, a total thickness of the protrusion and the pixel definition structure is H1, and 1.5 $\mu$m$\leq$H1$\leq$2.5 $\mu$m.

9. The display panel of claim 1, wherein:

shape of an orthographic projection of the first protrusion on the substrate is the same as shape of an orthographic projection of the second protrusion on the substrate.

10. The display panel of claim 1, wherein:

a first groove is formed between a second sidewall of the first protrusion and a second side wall of the second protrusion, the protrusion includes a first top surface away from the substrate, an angle between the first top surface and the second side wall being $\theta$, 85°$\leq$$\theta$<180°, and $\beta$$\leq$90°.

11. The display panel of claim 1, wherein:

in a direction perpendicular to the substrate, at least one of the second grooves has a depth of H2, and 0.7 $\mu$m$\leq$H2$\leq$1.3 $\mu$m.

12. The display panel of claim 1, wherein:

a surface of at least one of the first protrusion, the second protrusion, and the boss facing away from the pixel definition structure is a convex arc surface.

13. The display panel of claim 1, wherein:

at least one of the first protrusion, the second protrusion, and the boss includes a recess, the recess being recessed from a surface of the protrusion or the boss away from the pixel definition structure toward the pixel definition structure, a depth of the recess being greater than a depth of the second grooves.

14. The display panel of claim 13, wherein:

heights of the first protrusion and the second protrusion are greater than or equal to a height of the boss, and the recess is formed on both the first protrusion and the second protrusion.

15. The display panel of claim 13, wherein:

the light emitting device layer further includes an anode, the anode being located on one side of the pixel definition structure facing the substrate, in the direction perpendicular to the substrate, a distance between a surface of the anode away from the substrate and a bottom surface of the recess is D0, 0.7 $\mu$m$\leq$D0$\leq$1 $\mu$m.

16. A display device comprising the display panel according to claim 1.

* * * * *